(12) United States Patent
Sato et al.

(10) Patent No.: US 12,696,626 B2
(45) Date of Patent: Jul. 28, 2026

(54) DISPLAY DEVICE

(71) Applicant: SEMICONDUCTOR ENERGY LABORATORY CO., LTD., Atsugi (JP)

(72) Inventors: Rai Sato, Tochigi (JP); Masahiro Katayama, Tochigi (JP); Naoto Goto, Tochigi (JP); Yasutaka Nakazawa, Tochigi (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 423 days.

(21) Appl. No.: 18/264,476

(22) PCT Filed: Jan. 28, 2022

(86) PCT No.: PCT/IB2022/050739
§ 371 (c)(1),
(2) Date: Aug. 7, 2023

(87) PCT Pub. No.: WO2022/172115
PCT Pub. Date: Aug. 18, 2022

(65) Prior Publication Data
US 2024/0040846 A1 Feb. 1, 2024

(30) Foreign Application Priority Data
Feb. 12, 2021 (JP) ................................ 2021-020656

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/35* (2023.02); *H10K 71/233* (2023.02)

(58) Field of Classification Search
CPC .. H10K 59/122; H10K 59/1201; H10K 59/35; H10K 71/233
See application file for complete search history.

(56) References Cited

U.S. PATENT DOCUMENTS

| | | |
|---|---|---|
| 5,953,985 A | 9/1999 | Kobayashi |
| 6,120,338 A | 9/2000 | Hirano et al. |

(Continued)

FOREIGN PATENT DOCUMENTS

| | | |
|---|---|---|
| CN | 001617639 A | 5/2005 |
| CN | 001692679 A | 11/2005 |

(Continued)

OTHER PUBLICATIONS

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

(Continued)

*Primary Examiner* — Anne M Hines
(74) *Attorney, Agent, or Firm* — Fish & Richardson P.C.

(57) ABSTRACT

A display device with high resolution is provided. A display device with a high aperture ratio is provided. The display device includes a first pixel electrode, a second pixel electrode, a first insulating layer, a second insulating layer, a first EL layer, a second EL layer, and a common electrode. The first insulating layer covers end portions of the first pixel electrode and the second pixel electrode. The second insulating layer is provided over the first pixel electrode, the second pixel electrode, and the first insulating layer and (Continued)

covers an end portion of the first insulating layer. The first EL layer is provided over the first pixel electrode and the second EL layer is provided over the second pixel electrode. An end portion of the first EL layer and an end portion of the second EL layer face each other and overlap with the first insulating layer. The common electrode includes a portion overlapping with the first EL layer and a portion overlapping with the second EL layer. The first insulating layer includes an organic resin, and the second insulating layer includes an inorganic insulating material.

12 Claims, 22 Drawing Sheets

(51) Int. Cl.
*H10K 59/35* (2023.01)
*H10K 71/20* (2023.01)

(56) References Cited

U.S. PATENT DOCUMENTS

| | | | |
|---|---|---|---|
| 7,291,970 B2 | 11/2007 | Kuwabara | |
| 7,294,856 B2 | 11/2007 | Ito et al. | |
| 7,795,809 B2 | 9/2010 | Ito et al. | |
| 7,863,814 B2 | 1/2011 | Mitsuya et al. | |
| 8,358,057 B2 | 1/2013 | Oota | |
| 9,035,330 B2 | 5/2015 | Kang et al. | |
| 10,374,018 B2 | 8/2019 | Aoyama et al. | |
| 11,659,758 B2 | 5/2023 | Kamada et al. | |
| 2002/0072139 A1 | 6/2002 | Kashiwabara | |
| 2005/0057151 A1 | 3/2005 | Kuwabara | |
| 2005/0112341 A1 | 5/2005 | Ito et al. | |
| 2008/0303424 A1 | 12/2008 | Mitsuya et al. | |
| 2011/0148290 A1 | 6/2011 | Oota | |
| 2011/0272715 A1* | 11/2011 | Kang | H10K 59/122 |
| | | | 438/34 |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2014/0197394 A1 | 7/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2020/0203662 A1 | 6/2020 | Mollard et al. | |
| 2021/0005669 A1 | 1/2021 | Kamada et al. | |
| 2023/0255094 A1 | 8/2023 | Kamada et al. | |

FOREIGN PATENT DOCUMENTS

| | | |
|---|---|---|
| CN | 101296539 A | 10/2008 |
| CN | 112186111 A | 1/2021 |
| JP | 2000-036385 A | 2/2000 |
| JP | 2003-059663 A | 2/2003 |
| JP | 2004-319119 A | 11/2004 |
| JP | 2005-174906 A | 6/2005 |
| JP | 2008-098106 A | 4/2008 |
| JP | 2008-147072 A | 6/2008 |
| JP | 2008-251270 A | 10/2008 |
| JP | 2008-270118 A | 11/2008 |
| JP | 2011-238597 A | 11/2011 |
| JP | 2012-015129 A | 1/2012 |
| JP | 2012-160473 A | 8/2012 |
| JP | 2014-120218 A | 6/2014 |
| JP | 2014-135251 A | 7/2014 |
| JP | 2014-150057 A | 8/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| JP | 2021-012366 A | 2/2021 |
| KR | 2005-0045824 A | 5/2005 |
| KR | 2005-0053640 A | 6/2005 |
| KR | 2008-0095765 A | 10/2008 |
| KR | 2011-0123528 A | 11/2011 |
| KR | 2021-0004867 A | 1/2021 |
| TW | 200517008 | 5/2005 |
| TW | 202104541 | 2/2021 |
| WO | WO-2004/026002 | 3/2004 |
| WO | WO-2018/087625 | 5/2018 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2022/050739) Dated Apr. 19, 2022.

Written Opinion (Application No. PCT/IB2022/050739) Dated Apr. 19, 2022.

* cited by examiner

FIG. 1A
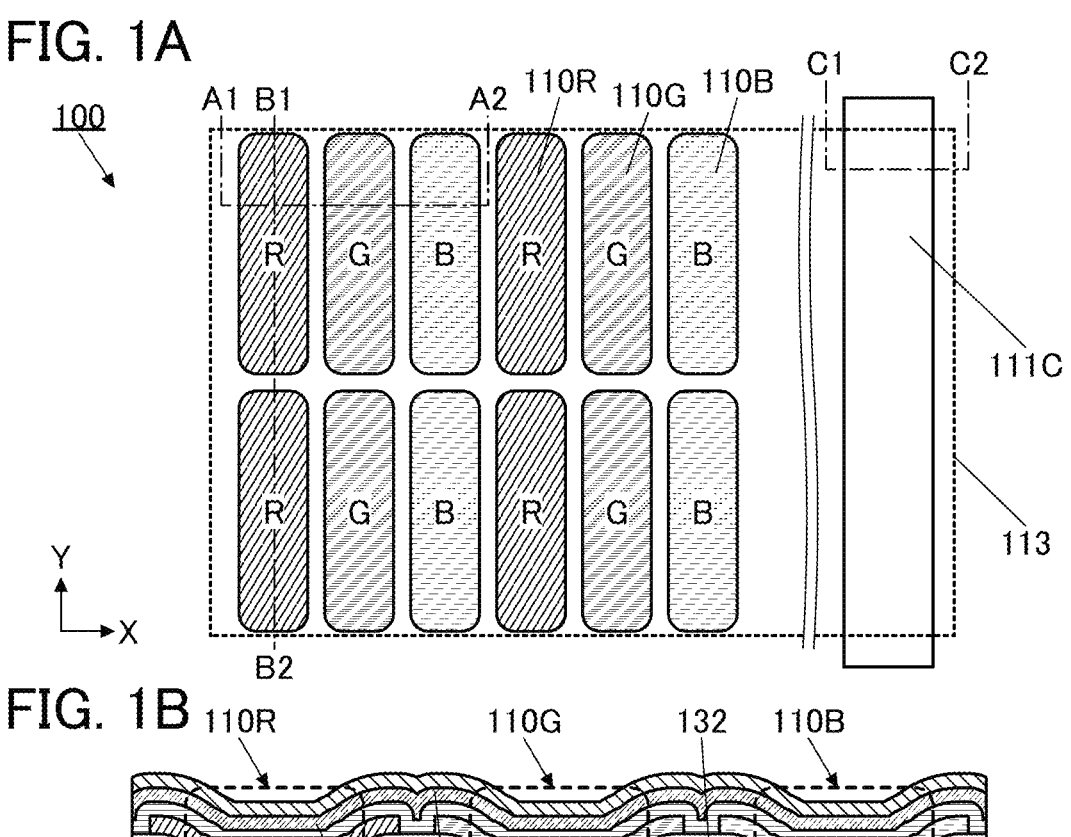
FIG. 1B
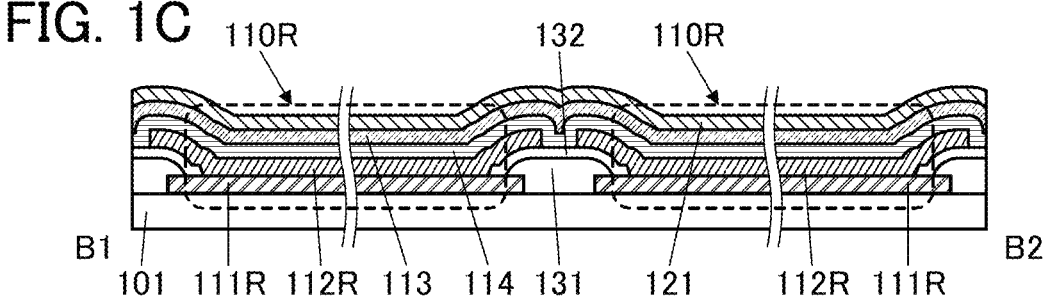
FIG. 1C
FIG. 1D
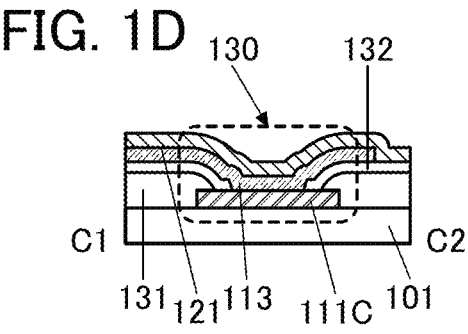

101   111R          111G          111B       111C 101   111R   151   152  111G  131f          111B       111C 101   111R          111G   131          111B  131   111C 101   111R          111G   131   132f   111B  131   111C 101   111R   151  141f  153  111G   131   132f   111B  131   111C 101   111R          141   111G   131   132f   111B  131   111C 101   111R          111G   131   132   111B   111C 101  111R  112R  145a  147a  112Gf  111G  144b  146b  132  111B  131  111C

143b 101  111R  112R  145a  147a  112Gf  111G  144b  146b  132  111B  131  111C

143b 101  111R  112R  145a  147a  112Gf  111G  144b  147b  132  111B  131  111C 101  111R  112R  145a  147a  112Gf  111G  145b  147b  132  111B  131  111C 145c  147c 101  111R  112R  145a  147a  111G  112G  145b  147b  132  112B  111B  131  111C

FIG. 8A
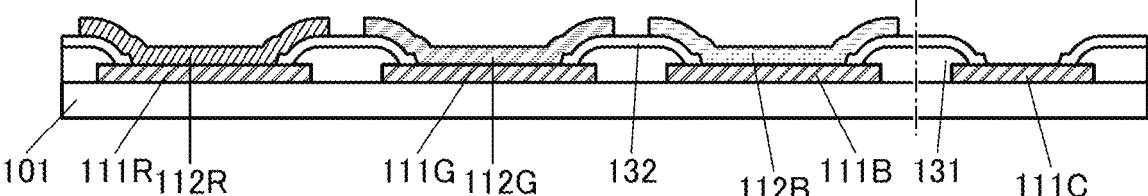
101    111R 112R              111G 112G       132        112B 111B 131      111C
FIG. 8B
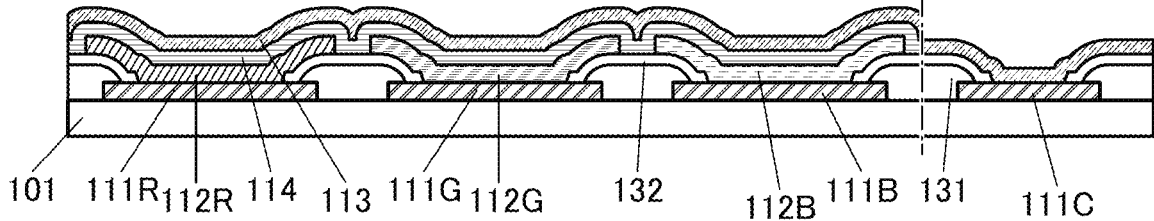
101    111R 112R  114   113  111G 112G       132          112B 111B 131      111C
FIG. 8C
101    111R 112R  114   113  111G 112G  121   132        112B 111B 131      111C 101   111R 112R          111G 112G          132          112B 111B   131      111C 101   111R 112R  114   113  111G 112G          132          112B 111B  131  114      111C 101   111R 112R  114   113  111G 112G  121   132          112B 111B  131  114      111C

100E 110R      110G      110B 101   111R   112R   113   121   111G   112G   114   111B   112B   131   132

100F 110G        110G 101   111G   112G   113   132   131   121   114     112G   111G

100F 110G        110G 101   111G   112G   113   132   131   121   114     112G   111G

400A

400B

FIG. 16A
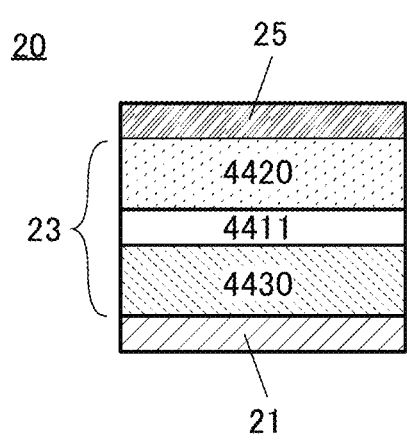
FIG. 16B
FIG. 16C
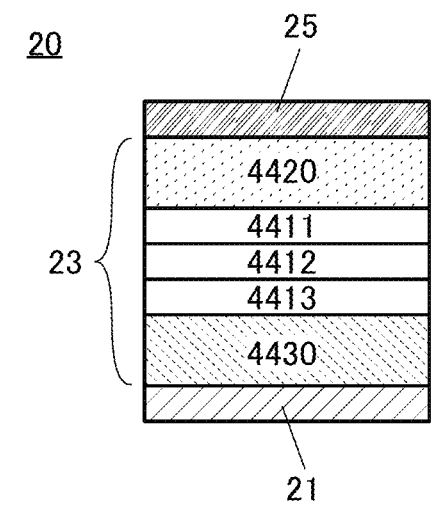
FIG. 16D
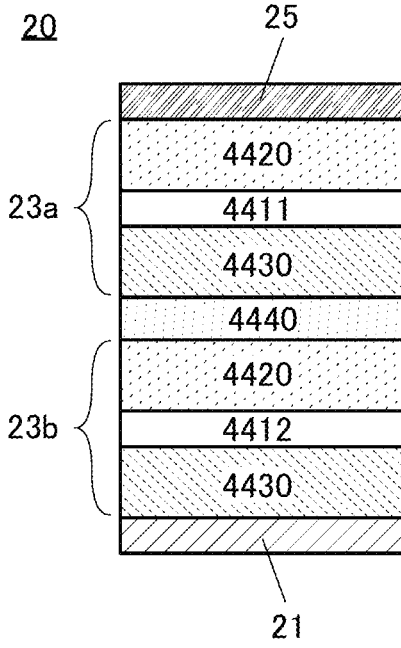

FIG. 19A
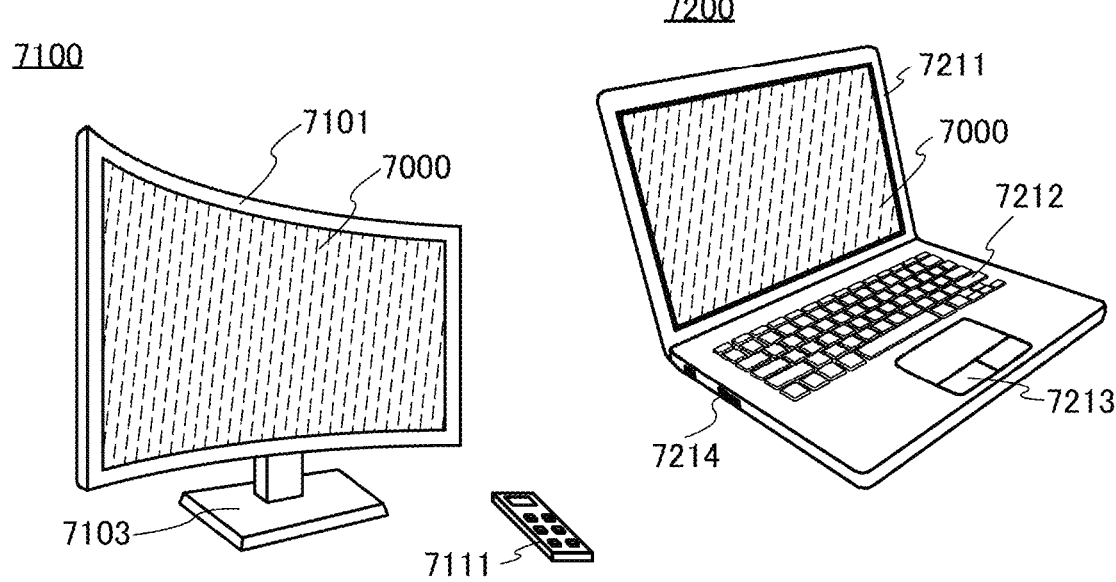
7100
7101
7000
7103
7111
FIG. 19B
7200
7211
7000
7212
7213
7214
FIG. 19C
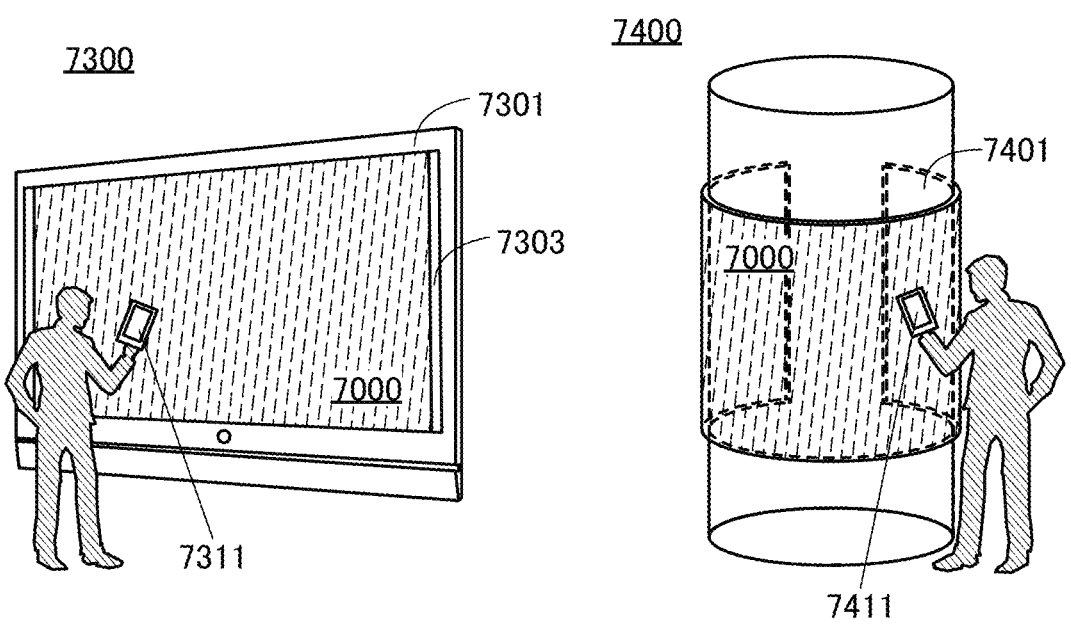
7300
7301
7303
7000
7311
FIG. 19D
7400
7401
7000
7411

FIG. 20A
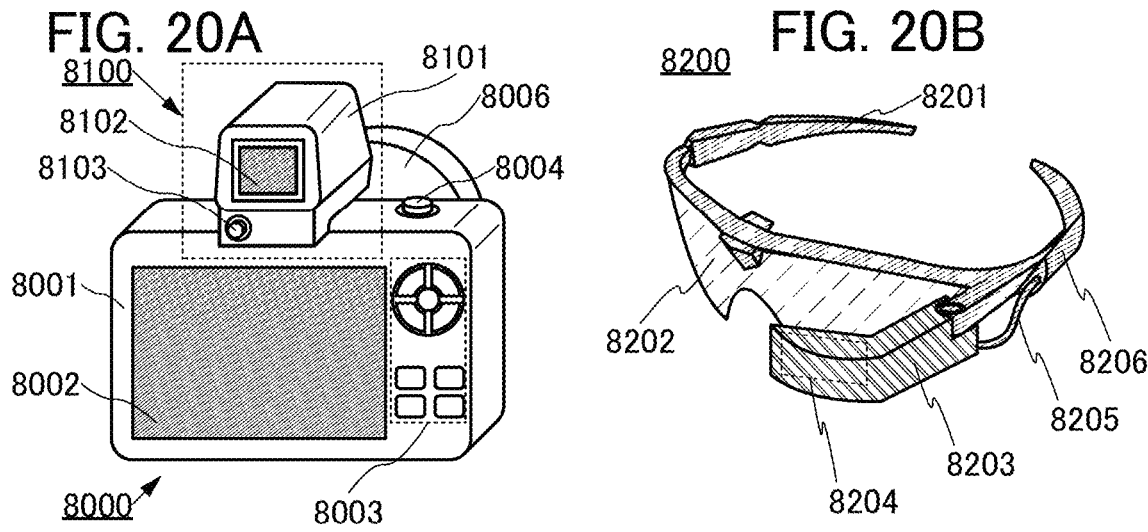
8100
8101
8102
8006
8103
8004
8001
8002
8003
8000
FIG. 20B
8200
8201
8202
8206
8205
8203
8204
FIG. 20C
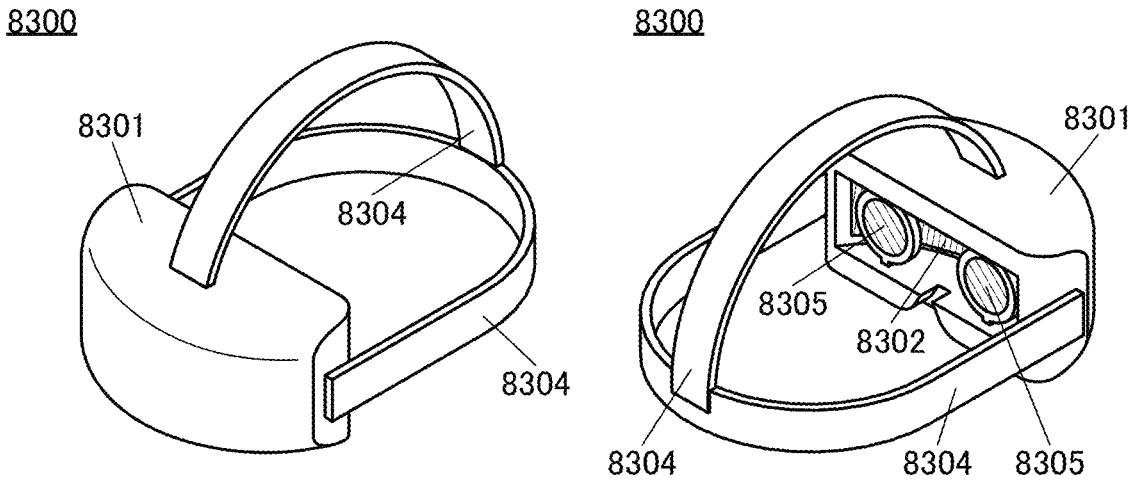
8300
8301
8304
8304
FIG. 20D
8300
8301
8305
8302
8304
8304
8305
FIG. 20E
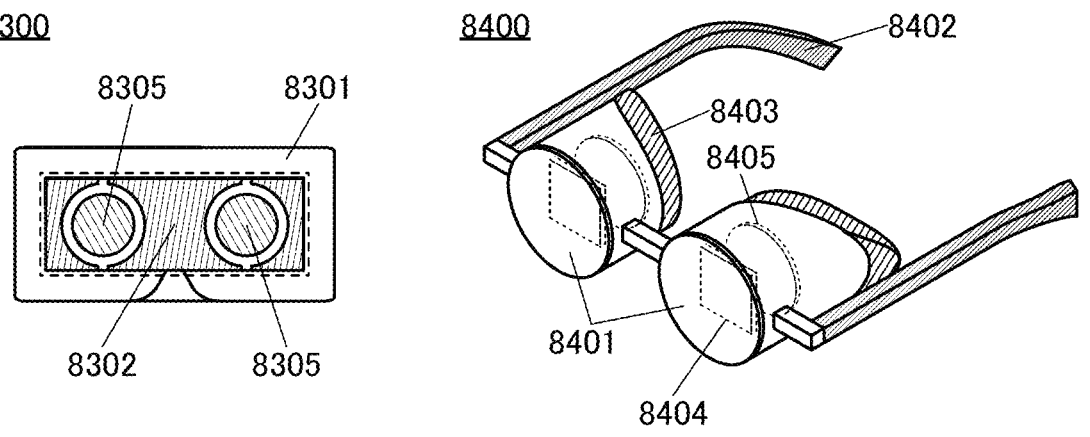
8300
8305
8301
8302
8305
FIG. 20F
8400
8402
8403
8405
8401
8404

9101

9200

9102

9201

9201

9201

DISPLAY DEVICE

CROSS REFERENCE TO RELATED APPLICATIONS

This application is a U.S. National Phase Application under 35 U.S.C. § 371 of International Application PCT/IB2022/050739, filed on Jan. 28, 2022, which is incorporated by reference and claims the benefit of a foreign priority application filed in Japan on Feb. 12, 2021, as Application No. 2021-020656.

TECHNICAL FIELD

One embodiment of the present invention relates to a display device. One embodiment of the present invention relates to a fabrication method of the display device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a notebook personal computer. Furthermore, higher resolution has been required for a stationary display device such as a television device or a monitor device along with an increase in definition. Examples of devices required to have the highest resolution include devices for virtual reality (VR) and augmented reality (AR).

Examples of display devices that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

Patent Document 1, for example, discloses an example of a display device for VR using an organic EL element.

REFERENCE

Patent Document

[Patent Document 1] PCT International Publication No. 2018/087625

SUMMARY OF THE INVENTION

Problems to be Solved by the Invention

An object of one embodiment of the present invention is to provide a high-resolution display device. Another object of one embodiment of the present invention is to provide a display device with a high aperture ratio. Another object of one embodiment of the present invention is to provide a display device with both high display quality and high resolution. Another object of one embodiment of the present invention is to provide a high-contrast display device.

Another object of one embodiment of the present invention is to provide a highly reliable display device.

Another object of one embodiment of the present invention is to provide a display device with a novel structure or a fabrication method of the display device. Another object of one embodiment of the present invention is to provide a manufacturing method of the above-described display device with high yield. Another object of one embodiment of the present invention is to at least reduce at least one of problems of the conventional technique.

Note that the description of these objects does not preclude the existence of other objects. Note that one embodiment of the present invention does not have to achieve all the objects. Note that objects other than these can be derived from the descriptions of the specification, the drawings, the claims, and the like.

Means for Solving the Problems

One embodiment of the present invention is a display device including a first pixel electrode, a second pixel electrode, a first insulating layer, a second insulating layer, a first EL layer, a second EL layer, and a common electrode. The first pixel electrode and the second pixel electrode are provided side by side. The first insulating layer covers an end portion of the first pixel electrode and an end portion of the second pixel electrode. Part of an end portion of the first insulating layer overlaps with a top surface of the first pixel electrode, and another part thereof overlaps with a top surface of the second pixel electrode. The second insulating layer is provided over the first pixel electrode, the second pixel electrode, and the first insulating layer and covers the end portion of the first insulating layer. Part of an end portion of the second insulating layer overlaps with the top surface of the first pixel electrode, and another part thereof overlaps with the top surface of the second pixel electrode. The first EL layer is provided over the first pixel electrode, and the second EL layer is provided over the second pixel electrode. An end portion of the first EL layer and an end portion of the second EL layer are opposed to each other and overlap with the first insulating layer. The common electrode includes a portion overlapping with the first EL layer and a portion overlapping with the second EL layer. The first insulating layer includes an organic resin and the second insulating layer includes an inorganic insulating material.

In the above structure, the first insulating layer preferably includes a curved surface between a top surface and the end portion. The second insulating layer preferably includes a portion in which an angle formed by a side surface and a bottom surface is greater than or equal to 20° and less than 90°.

In any of the above structures, the first insulating layer preferably includes an acrylic resin, a polyimide resin, an epoxy resin, a polyamide resin, a polyimide-amide resin, a siloxane resin, a benzocyclobutene-based resin, a phenol resin, or a precursor of any of these resins.

In any of the above structures, the second insulating layer preferably includes silicon oxide, silicon oxynitride, silicon nitride oxide, silicon nitride, aluminum oxide, aluminum oxynitride, hafnium oxide, indium gallium oxide, or indium gallium zinc oxide.

In any of the above structures, the second insulating layer may include a depressed portion in a region overlapping with neither the first EL layer nor the second EL layer. Alternatively, the second insulating layer may be separated in a region overlapping with neither the first EL layer nor the second EL layer.

In any of the above structures, the second insulating layer preferably includes a first insulating film and a second insulating film over the first insulating film. In that case, a first angle formed by a side surface and a bottom surface of the first insulating film is preferably different from a second angle formed by a side surface and a bottom surface of the second insulating film.

In the above structure, it is preferable that the first insulating film be thinner than the second insulating film and the first angle be greater than the second angle. Alternatively, it is preferable that the second insulating film be thinner than the first insulating film and the second angle be greater than the first angle.

In any of the above structures, it is preferable that the first insulating film include a silicon nitride film and the second insulating film include a silicon oxide film.

One embodiment of the present invention is a fabrication method of a display device, including: forming a first pixel electrode and a second pixel electrode; forming a photosensitive resin film to cover the first pixel electrode and the second pixel electrode; forming a first insulating layer to cover an end portion of the first pixel electrode and an end portion of the second pixel electrode by performing light exposure by using a first photomask and development on the resin film; forming an inorganic insulating film to cover the first pixel electrode, the second pixel electrode, and the first insulating layer; forming a resist film over the inorganic insulating layer; forming a resist mask by performing light exposure by using the first photomask and development on the resist film; and forming a second insulating layer to cover a top surface of the first pixel electrode, a top surface of the second pixel electrode, and a top surface of the first insulating layer by etching the inorganic insulating film that is not covered by the resist mask.

In the above method, it is preferable that after the formation of the second insulating layer, a first EL layer be formed over the first pixel electrode; a second EL layer be formed over the second pixel electrode; and a common electrode be formed over the first EL layer and the second EL layer. In that case, it is preferable that the first EL layer and the second EL layer be processed into island shapes or band-like shapes by a photolithography method.

Effect of the Invention

According to one embodiment of the present invention, a high-resolution display device can be provided. A display device with both high display quality and high resolution can be provided. A high-contrast display device can be provided. A highly reliable display device can be provided.

According to one embodiment of the present invention, a display device with a novel structure or a fabrication method of the display device can be provided. A manufacturing method of the above-described display device with high yield can be provided. One embodiment of the present invention can at least reduce at least one of problems of the conventional technique.

Note that the description of these effects does not preclude the existence of other effects. Note that one embodiment of the present invention does not need to have all of these effects. Note that effects other than these can be derived from the descriptions of the specification, the drawings, the claims, and the like.

BRIEF DESCRIPTION OF THE DRAWINGS

FIG. 1A to FIG. 1D are diagrams illustrating a structure example of a display device.

FIG. 8A to FIG. 8C are diagrams illustrating an example of a fabrication method of a display device.

FIG. 16A to FIG. 16D are diagrams illustrating structure examples of a light-emitting element.

FIG. 19A to FIG. 19D are diagrams illustrating examples of electronic devices.

FIG. 20A to FIG. 20F are diagrams illustrating examples of electronic devices.

MODE FOR CARRYING OUT THE INVENTION

Figure 2A:
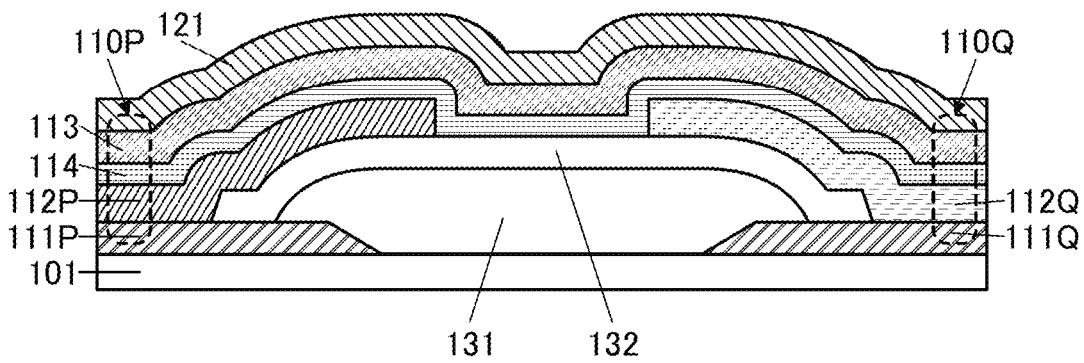
FIG. 2A and FIG. 2B are diagrams illustrating a structure example of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as "first," "second," and the like are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display device of one embodiment of the present invention and an example of a fabrication method of the display device will be described.

One embodiment of the present invention is a display device including a light-emitting element (also referred to as a light-emitting device). The display device includes at least two light-emitting elements of different emission colors. The light-emitting elements each include a pair of electrodes and an EL layer therebetween. The light-emitting elements are preferably organic EL elements (organic electroluminescent elements). Two or more light-emitting elements emitting different colors include respective EL layers containing different materials. For example, three kinds of light-emitting elements emitting red (R), green (G), and blue (B) light are included, whereby a full-color display device can be obtained.

As a way of forming some or all of EL layers separately between light-emitting elements of different emission colors, an evaporation method using a shadow mask such as a metal mask is known. However, this method causes a deviation from the designed shape and position of an island-shaped organic film due to various influences such as the low accuracy of the metal mask, the positional deviation between the metal mask and a substrate, a warp of the metal mask, and the expansion of outline of the deposited film caused by vapor-scattering or the like; accordingly, it is difficult to achieve high resolution and a high aperture ratio of the display device. Thus, a measure has been taken for pseudo improvement in resolution (also referred to pixel density) by employing a unique pixel arrangement method such as a PenTile arrangement.

In one embodiment of the present invention, fine patterning of an EL layer is performed without a shadow mask such as a metal mask. This can achieve a display device with high resolution and a high aperture ratio, which has been difficult to achieve. Moreover, EL layers can be separately formed, enabling the display device to perform extremely clear display with high contrast and high display quality.

Here, a description is made on a case where EL layers in light-emitting elements of two colors are separately formed, for simplicity. First, a stack of a first EL film and a first sacrificial film is formed to cover two pixel electrodes. Next, a resist mask is formed in a position overlapping with one pixel electrode (a first pixel electrode) over the first sacrificial film. Then, part of the first sacrificial film and part of the first EL film that are not overlapping with the resist mask are etched. In this case, the etching is stopped when the other pixel electrode (a second pixel electrode) is exposed. Thus, part of the first EL film processed into a band-like shape or island shape (also referred to as a first EL layer) can be formed over the first pixel electrode, and part of the sacrificial film (also referred to as a first sacrificial layer) can be formed thereover.

Next, a stack of a second EL film and a second sacrificial film is formed. Then, a resist mask is formed in a position overlapping with the second pixel electrode. Then, part of the second sacrificial film and part of the second EL film that are not overlapping with the resist mask are etched in a manner similar to the above. As a result, a state in which the first EL layer and the first sacrificial layer are provided over the first pixel electrode, and a second EL layer and a second sacrificial layer are provided over the second pixel electrode is obtained. In this manner, the first EL layer and the second EL layer can be separately formed. Finally, the first sacrificial layer and the second sacrificial layer are removed to expose the first EL layer and the second EL layer and then a common electrode is formed, whereby light-emitting elements of two colors can be separately formed.

Furthermore, by repeating the above-described steps, EL layers in light-emitting elements of three or more colors can be separately formed; accordingly, a display device including light-emitting elements of three colors or four or more colors can be achieved.

Here, a first insulating layer is provided to cover end portions of the first pixel electrode and the second pixel electrode. Providing the first insulating layer can improve the step coverage with the first EL layer and the second EL layer. In addition, an increase in leakage current, an electrical short circuit between the first pixel electrode or the second pixel electrode and the common electrode, and the like caused by a reduction in the thickness of the first EL layer or the second EL layer in the end portion of the first pixel electrode or the second pixel electrode can be inhibited.

In addition, a second insulating layer is provided to cover the first insulating layer. In this case, the second insulating layer is preferably formed to have a larger pattern than the first insulating layer. Specifically, in a plan view, it is preferable to form the first insulating layer and the second insulating layer so that the first insulating layer is positioned inward from the outline of the second insulating layer. In that case, the first insulating layer is covered by the second insulating layer. An end portion of the second insulating layer includes portions overlapping with the first pixel electrode and the second pixel electrode.

An insulating film containing an inorganic insulating material is preferably used for the second insulating film. An insulating film having etching resistance at the time of an etching step of the first EL layer and the second EL layer is further preferably used. Furthermore, an insulating film having etching resistance at the time of a step of removing the first sacrificial layer and the second sacrificial layer is preferably used.

On the other hand, an insulating film containing an organic insulating material such as an organic resin is preferably used for the first insulating layer. In that case, it is preferable that the first insulating layer have a curved shape with a moderate slope from the end portion to the top surface. This can improve the step coverage with the first EL layer and the second EL layer.

By providing the second insulating layer over the first insulating layer, some or all of the first insulating layer can be inhibited from being etched at the time of etching of the first EL layer or the second EL layer. In addition, the disconnection of a common electrode caused by the formation of a depressed portion in the first insulating layer at the time of etching of the first EL layer or the second EL layer, which increases the height difference between the top surface of the first insulating layer and each of the top surfaces of the first EL layer and the second EL layer, can be inhibited when the common electrode is formed.

In this manner, by covering the end portions of the first pixel electrode and the second pixel electrode by a stacked film in which the first insulating layer containing an organic resin and the second insulating layer containing an inorganic insulating material are stacked, a highly reliable display device can be achieved.

Here, it is preferable that the first insulating layer and the second insulating layer be processed using the same photomask (light exposure mask). For example, a photosensitive organic resin is deposited and exposed to light using a photomask and then developed to form the first insulating layer. In this case, light exposure conditions are controlled so that the first insulating layer is formed to have a pattern width narrower than the pattern width of the photomask. The second insulating layer can be formed by forming a resist mask that is patterned using the above photomask over an insulating film and etching a portion of the insulating film that is not covered by the resist mask. In this case, light exposure conditions of the resist mask are controlled so that the resist mask is formed to have a pattern width greater than the pattern width of the first insulating layer. In this manner, insulating layers with different pattern widths can be separately formed by using the same photomask.

Here, an electrode (also referred to as a first electrode, a connection electrode, or the like), which is to supply a potential to the common electrode, can be provided on the same plane as the pixel electrodes so that the connection electrode and the common electrode can be electrically connected to each other. The connection electrode is positioned outward from a display portion in which pixels are provided. The first insulating layer and the second insulating layer are also preferably provided over the connection electrode to cover its end portion.

Here, in order to prevent the top surface of the connection electrode from being exposed in the etching of the above first EL film, it is preferable that the first sacrificial layer be also provided over the connection electrode. Similarly, the second sacrificial layer is preferably provided over the connection electrode in the etching of the second EL film. The first sacrificial layer and the second sacrificial layer provided over the connection electrode can be removed by etching concurrently with the first sacrificial layer over the first EL layer and the second sacrificial layer over the second EL layer.

It is difficult to set the distance between the EL layers for different colors to be less than 10 μm with a formation method using a metal mask, for example; however, with use of the above method, the distance can be decreased to be less than or equal to 3 μm, less than or equal to 2 μm, or less than or equal to 1 μm. For example, with use of an light exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80% or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern, causing a reduction in effective area that can be used for a light-emitting region with respect to the entire pattern area. In contrast, in the above fabrication method, a pattern is formed by processing a film deposited to have a uniform thickness, which enables a uniform thickness in the pattern; thus, even with a fine pattern, almost the entire area can be used for a light-emitting region. Therefore, the above fabrication method makes it possible to achieve both high resolution and a high aperture ratio.

In addition, the first insulating layer and the second insulating layer provided between two adjacent pixel electrodes are provided to cover the end portion of the pixel electrode. A region covered by the second insulating layer over the pixel electrode does not function as a light-emitting region of the light-emitting element; therefore, as the width of the region where the second insulating layer and the pixel electrode overlap with each other is smaller, an effective light-emitting area ratio, i.e., aperture ratio, of the display device can be increased.

An end portion of the EL layer is positioned over the first insulating layer and the second insulating layer. In this case, the side surfaces of two EL layers are placed to face each other over the second insulating layer. In the case where the distance between the two EL layers is smaller, the width of the insulating layer can be smaller; thus, the aperture ratio of the display device can be increased. For example, the distance between the side surfaces of two EL layers facing each other can be less than or equal to 5 μm, preferably less than or equal to 4 μm, further preferably less than or equal to 3 μm, still further preferably less than or equal to 2 μm, yet further preferably less than or equal to 1 μm, and greater than or equal to 10 nm, 50 nm, or greater than or equal to 100 nm.

As described above, one embodiment of the present invention can achieve a display device in which minute light-emitting elements are integrated. The display device can have resolution higher than or equal to 500 ppi, higher than or equal to 1000 ppi, higher than or equal to 2000 ppi, higher than or equal to 3000 ppi, or higher than or equal to 5000 ppi while having what is called a stripe pattern where R, G, and B are arranged in one direction because it is not necessary to conduct a pseudo improvement in resolution with a unique pixel arrangement such as a PenTile arrangement. Furthermore, the display device can have an effective light-emitting area ratio (aperture ratio) of greater than or equal to 50%, greater than or equal to 60%, or greater than or equal to 70%, and less than 100%.

In one embodiment of the present invention, a minute light-emitting element can be fabricated with high accuracy, so that a complex arrangement method of pixels can be achieved. For example, various arrangement methods such as an S-stripe arrangement, a Bayer arrangement, and a delta alignment can be employed in addition to a stripe arrangement.

Note that in this specification and the like, an effective light-emitting area ratio is the proportion of the area of a region that can be regarded as a light-emitting region in one pixel, with respect to the area of one pixel that is calculated from a repeated pixel pitch in a display device.

More specific structure examples and fabrication method examples of the display device of one embodiment of the present invention are described below with reference to drawings.

Structure Example 1

In FIG. 1A, a schematic top view of a display device 100 of one embodiment of the present invention is illustrated. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called a stripe arrangement, in which light-emitting elements of the same color are arranged in one direction. Note that the arrangement method of the light-emitting elements is not limited thereto; another arrangement method such as an S-stripe arrangement, a delta arrangement, a Bayer arrangement, or a zigzag arrangement may be employed, or a PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

For the light-emitting elements 110R, the light-emitting elements 110G, and the light-emitting elements 110B, EL elements such as OLEDs (Organic Light Emitting Diodes) or QLEDs (Quantum-dot Light Emitting Diodes) are preferably used. Examples of light-emitting substances contained in the EL elements include a substance that emits fluorescent light (a fluorescent material), a substance that emits phosphorescent light (a phosphorescent material), and a substance that exhibits thermally activated delayed fluorescence (a thermally activated delayed fluorescent (TADF) material). Examples of the light-emitting substances contained in the EL elements include inorganic compounds (e.g., quantum dot materials) in addition to organic compounds.

FIG. 1B is a schematic cross-sectional view taken along the dashed-dotted line A1-A2 in FIG. 1A, and FIG. 1C is a schematic cross-sectional view taken along the dashed-dotted line B1-B2.

FIG. 1B illustrates cross sections of the light-emitting element 110R, the light-emitting element 110G, and the light-emitting element 110B. The light-emitting element 110R includes a pixel electrode 111R, an EL layer 112R, an EL layer 114, and a common electrode 113. The light-emitting element 110G includes a pixel electrode 111G, an EL layer 112G, the EL layer 114, and the common electrode 113. The light-emitting element 110B includes a pixel electrode 111B, an EL layer 112B, the EL layer 114, and the common electrode 113. The EL layer 114 and the common electrode 113 are shared by the light-emitting element 110R, the light-emitting element 110G, and the light-emitting element 110B. The EL layer 114 can also be referred to as a common layer.

The EL layer 112R included in the light-emitting element 110R contains at least a light-emitting organic compound that emits light with intensity in the red wavelength range. The EL layer 112G included in the light-emitting element 110G contains at least a light-emitting organic compound that emits light with intensity in the green wavelength range. The EL layer 112B included in the light-emitting element 110B contains at least a light-emitting organic compound that emits light with intensity in the blue wavelength range.

The EL layer 112R, the EL layer 112G, and the EL layer 112B may each include one or more of an electron-injection layer, an electron-transport layer, a hole-injection layer, and a hole-transport layer in addition to a layer containing a light-emitting organic compound (the light-emitting layer). The EL layer 114 can have a structure without the light-emitting layer. For example, the EL layer 114 includes one or more of an electron-injection layer, an electron-transport layer, a hole-injection layer, and a hole-transport layer.

Here, the uppermost layer in the stacked-layer structure of each of the EL layer 112R, the EL layer 112G, and the EL layer 112B, i.e., the layer in contact with the EL layer 114, is preferably a layer other than the light-emitting layer. For example, a structure is preferable in which an electron-injection layer, an electron-transport layer, a hole-injection layer, a hole-transport layer, or a layer other than those is provided to cover the light-emitting layer so as to be in contact with the EL layer 114. When the top surface of the light-emitting layer is protected by another layer in fabricating each light-emitting element, the reliability of the light-emitting element can be improved.

The pixel electrode 111R, the pixel electrode 111G, and the pixel electrode 111B are provided for the respective light-emitting elements. The common electrode 113 and the EL layer 114 is provided as a continuous layer shared by the light-emitting elements. A conductive film having a transmitting property with respect to visible light is used for either the pixel electrodes or the common electrode 113, and a conductive film having a reflective property is used for the other. When the pixel electrodes have light-transmitting properties and the common electrode 113 has a reflective property, a bottom-emission display device can be obtained; in contrast, when the pixel electrodes have reflective properties and the common electrode 113 has a light-transmitting property, atop-emission display device can be obtained. Note that when both the pixel electrodes and the common electrode 113 have light-transmitting properties, a dual emission display device can be obtained.

An insulating layer 131 is provided to cover end portions of the pixel electrode 111R, the pixel electrode 111G, and the pixel electrode 111B. The insulating layer 131 is preferably tapered. Note that in this specification and the like, "an object is tapered" indicates that the object has a cross-sectional shape in which the angle formed by a surface and a formation surface (also referred to as a taper angle) is greater than 0° and less than 90° in a region vicinity of the end portion, and the thickness continuously increases from the end portion.

When an organic resin is used for the insulating layer 131, the surface can be moderately curved. Thus, coverage with a film formed over the insulating layer 131 can be improved.

Examples of materials that can be used for the insulating layer 131 include an acrylic resin, a polyimide resin, an epoxy resin, a polyamide resin, a polyimide-amide resin, a siloxane resin, a benzocyclobutene-based resin, a phenol resin, and precursors and the like of these resins.

An insulating layer 132 is provided over the insulating layer 131. The insulating layer 132 overlaps with the end portions of the pixel electrode 111R, the pixel electrode 111G, and the pixel electrode 111B with the insulating layer 131 therebetween. The insulating layer 132 is provided to cover an end portion of the insulating layer 131. The insulating layer 132 includes portions in contact with the top surfaces of the pixel electrode 111R, the pixel electrode 111G, and the pixel electrode 111B.

The insulating layer 132 is preferably tapered. Thus, the step coverage with a film formed over the insulating layer 132, such as an EL layer provided to cover an end portion of the insulating layer 132, can be improved.

It is preferable that the thickness of the insulating layer 132 be smaller than that of the insulating layer 131. When the insulating layer 132 is formed to be thin, the step coverage with a film formed over the insulating film 132 can be improved.

Examples of inorganic insulating materials that can be used for the insulating layer 132 include oxide and nitride such as silicon oxide, silicon oxynitride, silicon nitride oxide, silicon nitride, aluminum oxide, aluminum oxyni-tride, and hafnium oxide. In addition, yttrium oxide, zirco-nium oxide, gallium oxide, tantalum oxide, magnesium oxide, lanthanum oxide, cerium oxide, neodymium oxide, or the like may be used.

A film of metal oxide such as indium gallium oxide or indium gallium zinc oxide may be used for the insulating layer 132. Such a metal oxide film has electrical character-istics as a semiconductor and is high resistant; hence, there is almost no possibility that two pixel electrodes are elec-trically short-circuited through the insulating layer 132.

Films containing the above inorganic materials may be stacked for the insulating layer 132. For example, a stacked-layer structure in which a silicon oxide film or a silicon oxynitride film is stacked over a silicon nitride film, or a stacked-layer structure in which a silicon oxide film or a silicon oxynitride film is stacked over an aluminum oxide film can be employed. The silicon oxide film and the silicon oxynitride film are films especially not easily etched; hence, it is preferable that the films be placed on the upper side. Furthermore, the silicon nitride film and the aluminum oxide film are films through which water, hydrogen, oxygen, and the like are not easily diffused; hence, the films function as barrier films inhibiting the gas released from the insulating layer 131 from diffusing into the light-emitting elements when the films are placed on the insulating layer 131 side.

The EL layer 112R, the EL layer 112G, and the EL layer 112B each include a region in contact with the top surface of the pixel electrode and a region in contact with the surface of the insulating layer 131. The end portions of the EL layer 112R, the EL layer 112G, and the EL layer 112B are positioned over the insulating layer 131.

As illustrated in FIG. 1B, a gap is provided between the EL layers of two light-emitting elements of different emis-sion colors. Furthermore, as illustrated in FIG. 1C, a gap is also preferably provided between the EL layers of two light-emitting elements of the same color. In this manner, the EL layers 112R, the EL layers 112G, and the EL layers 112B are preferably provided so as not to be in contact with one another. This can suitably prevent unintentional light emis-sion due to current flow through two adjacent EL layers. As a result, the contrast can be increased to achieve a display device with high display quality.

Note that in the Y direction, a band-shaped EL layer 112R, a band-shaped EL layer 112G, or a band-shaped EL layer 112B may be formed so that the EL layers 112R, the EL layers 112G, or the EL layers 112B in the light-emitting elements of the same color become continuous. When the EL layer 112R and the like are formed in a band-like shape, a space for dividing the layers is not needed and thus the area of a non-light-emitting region between the light-emitting elements can be reduced, resulting in a higher aperture ratio.

A protective layer 121 is provided over the common electrode 113 to cover the light-emitting element 110R, the light-emitting element 110G, and the light-emitting element 110B. The protective layer 121 has a function of inhibiting diffusion of impurities such as water into the light-emitting elements from above.

The protective layer 121 can have, for example, a single-layer structure or a stacked-layer structure at least including an inorganic insulating film. For the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

For the protective layer 121, a stacked film of an inorganic insulating film and an organic insulating film can be used. For example, a structure in which an organic insulating film is sandwiched between a pair of inorganic insulating films is preferable. Furthermore, the organic insulating film prefer-ably functions as a planarization film. Accordingly, the top surface of the organic insulating film can be flat, and accordingly, coverage with the inorganic insulating film thereover is improved, leading to an improvement in barrier properties. Since the top surface of the protective layer 121 is flat, when a component (e.g., a color filter, an electrode of a touch sensor, or a lens array) is provided above the protective layer 121, the component is less affected by an uneven shape caused by components therebelow, which is preferable.

FIG. 1A illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside of a display region where the light-emitting elements 110R and the like are arranged. In FIG. 1A, the common electrode 113 is illustrated by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, the top surface of the connection electrode 111C can have a band-like shape, an L shape, a square bracket shape, a quadrangular shape, or the like.

FIG. 1D is a schematic cross-sectional view taken along the dashed-dotted line C1-C2 in FIG. 1A. FIG. 1D illustrates a connection portion 130 in which the connection electrode 111C and the common electrode 113 are electrically con-nected to each other. In the connection portion 130, the common electrode 113 is provided over and in contact with the connection electrode 111C and the protective layer 121 is provided to cover the common electrode 113. In addition, the insulating layer 131 and the insulating layer 132 are provided to cover an end portion of the connection electrode 111C.

Figure 2B:
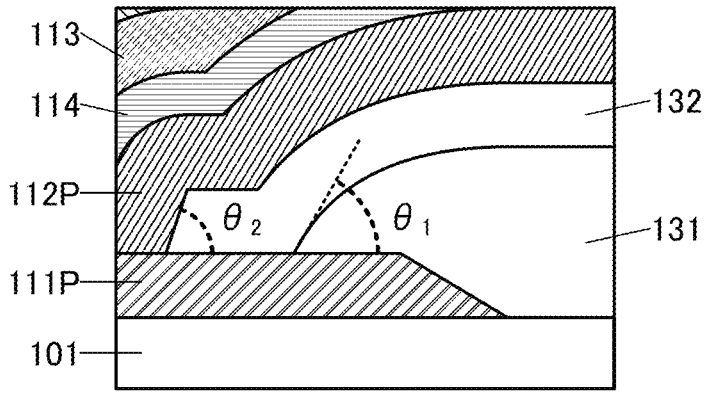

Next, preferred structures of the insulating layer 131, the insulating layer 132, and the vicinity thereof are described in detail. FIG. 2A illustrates an enlarged view of the insulating layer 131, the insulating layer 132, and the vicinity thereof which are between adjacent two light-emitting elements. FIG. 2B illustrates a more enlarged view of the end portion of the insulating layer 131, the end portion of the insulating layer 132, and the vicinity thereof.

Note that a light-emitting element 110P and a light-emitting element 110Q are illustrated as two given adjacent light-emitting elements. The light-emitting element 110P and the light-emitting element 110Q are each independently any of the light-emitting element 110R, the light-emitting element 110G, and the light-emitting element 110B. Similarly, an EL layer 112P and an EL layer 112Q are each any of the EL layer 112R, the EL layer 112G, and the EL layer 112B, and a pixel electrode 111P and a pixel electrode 111Q are each any of the pixel electrode 111R, the pixel electrode 111G, and the pixel electrode 111B.

The insulating layer 131 and the insulating layer 132 each include a portion overlapping with the EL layer 112P, a portion overlapping with the EL layer 112Q, and a portion overlapping with neither of these layers.

The insulating layer 131 includes a portion overlapping with the pixel electrode 111P, a portion overlapping with the pixel electrode 111Q, and a portion overlapping with neither of these electrodes. The insulating layer 132 over the insulating layer 131 includes a portion in contact with the pixel electrode 111P, a portion overlapping with the pixel electrode 111P with the insulating layer 131 therebetween, a portion in contact with the pixel electrode 111Q, and a portion overlapping with the pixel electrode 111Q with the insulating layer 131 therebetween.

As illustrated in FIG. 2B, an angle formed by the bottom surface and a side surface of the insulating layer 131 in the vicinity of the end portion (referred to as a taper angle) is denoted as an angle $\theta_1$ and an angle formed by the bottom surface and a side surface of the insulating layer 132 in the vicinity of the end portion is denoted as an angle $\theta_2$. Note that since the surface of the insulating layer 131 in the vicinity of the end portion has a curved shape, a tangent of the end portion of the insulating layer 131 is illustrated by a dashed-dotted line.

The angle $\theta_1$ of the insulating layer 131 is preferably smaller than the angle $\theta_2$ of the insulating layer 132. When the taper angle of the insulating layer 131 is reduced, formation of a low-density region in the insulating layer 132 can be inhibited.

The angle $\theta_1$ of the insulating layer 131 can be greater than 0° and less than 90°, preferably greater than or equal to 5° and less than or equal to 70°, further preferably greater than or equal to 10° and less than or equal to 60°, and still further preferably greater than or equal to 15° and less than or equal to 50°.

On the other hand, the angle $\theta_2$ of the insulating layer 132 can be greater than 0° and less than 90°, preferably greater than or equal to 10° and less than 90°, further preferably greater than or equal to 20° and less than 90°, and still further preferably greater than or equal to 25° and less than or equal to 85°.

Note that when the surface of the insulating layer 131 is curved, the top surface and a side surface are continuous and cannot be distinguished from each other in some cases. In that case, in a surface of the insulating layer 131 in the vicinity of the end portion, a surface of a portion whose thickness is increasing from the end portion can be regarded as a side surface, and a surface of a portion whose thickness is constant can be regarded as the top surface.

Figure 3A:
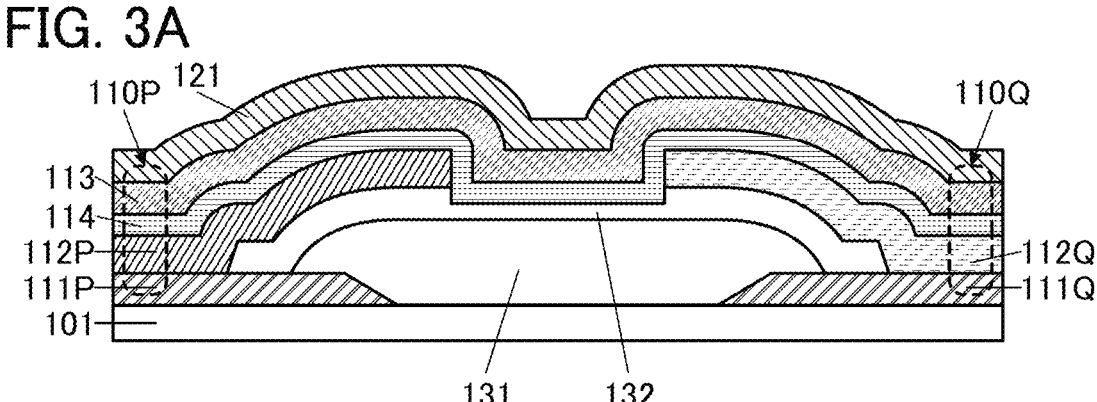
FIG. 3A to FIG. 3C are diagrams illustrating structure examples of a display device.

FIG. 3A illustrates an example in which part of the top surface of the insulating layer 132 is partly etched and a depressed portion is formed in the part of the insulating layer 132. The insulating layer 132 is thinner in a portion that is not covered by the EL layer 112P or the EL layer 112Q than in portions covered by the EL layers. Note that FIG. 3A shows the thickness of a portion of the insulating layer 132 that is covered by the EL layer 112P and the thickness of a portion of the insulating layer 132 that is covered by the EL layer 112Q as the same; however, these thicknesses may be different from each other.

Figure 3B:
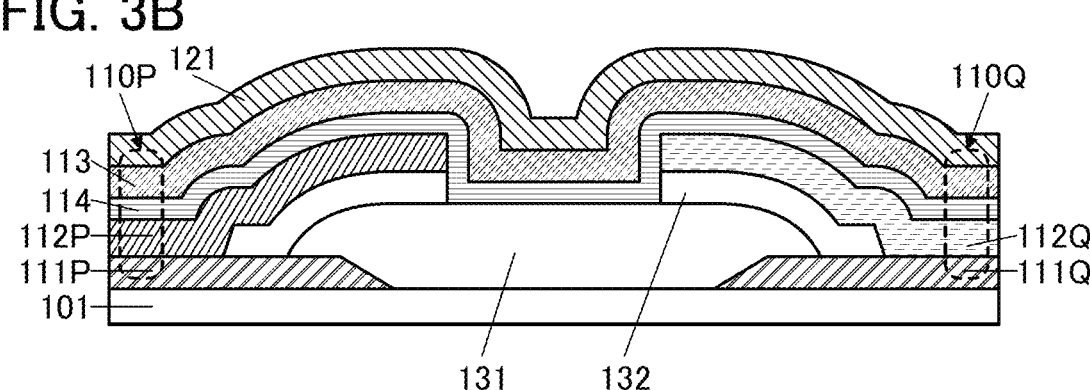

FIG. 3B illustrates an example in which a portion of the insulating layer 132 that is not covered by the EL layer 112P or the EL layer 112Q is removed by etching and the insulating layer 132 is divided into two parts.

Figure 3C:
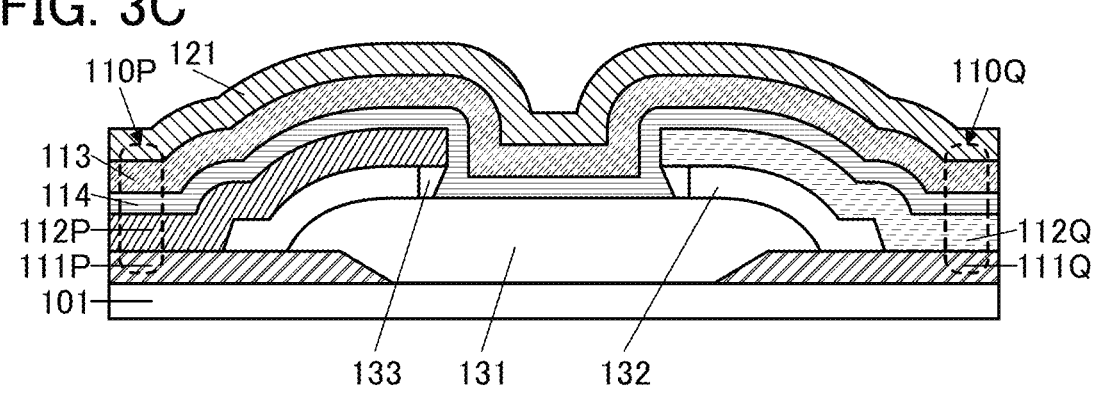

FIG. 3C illustrates an example in which etching makes the end surfaces of the insulating layer 132 in FIG. 3B recede. In FIG. 3C, a space 133 surrounded by the EL layer 112P, the insulating layer 132, the insulating layer 131, and the EL layer 114 is formed.

Figure 4A:
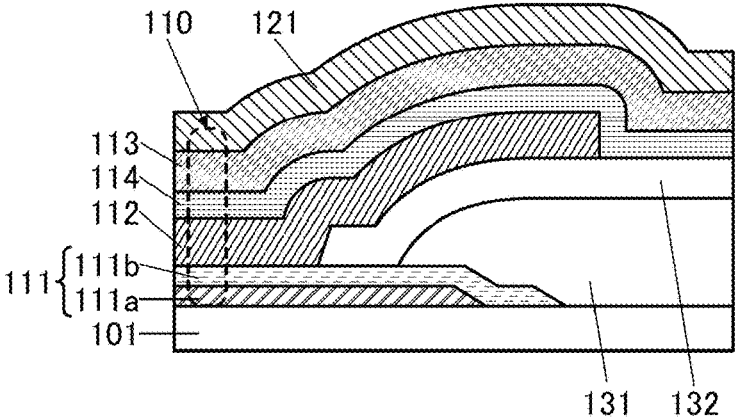
FIG. 4A to FIG. 4C are diagrams illustrating structure examples of a display device.
Figure 4B:
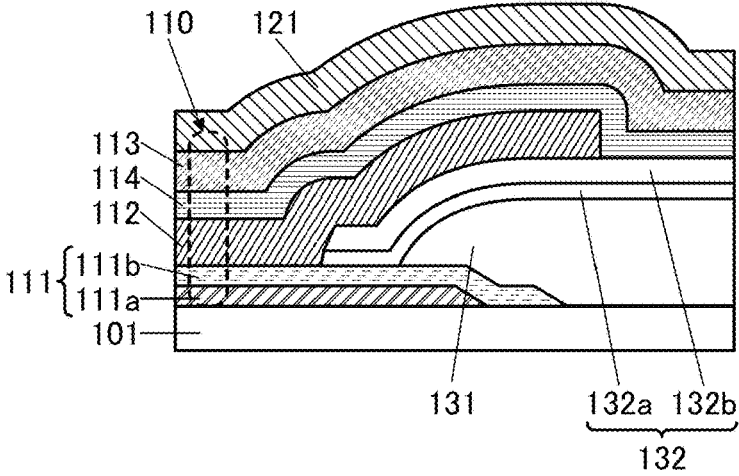
Figure 4C:
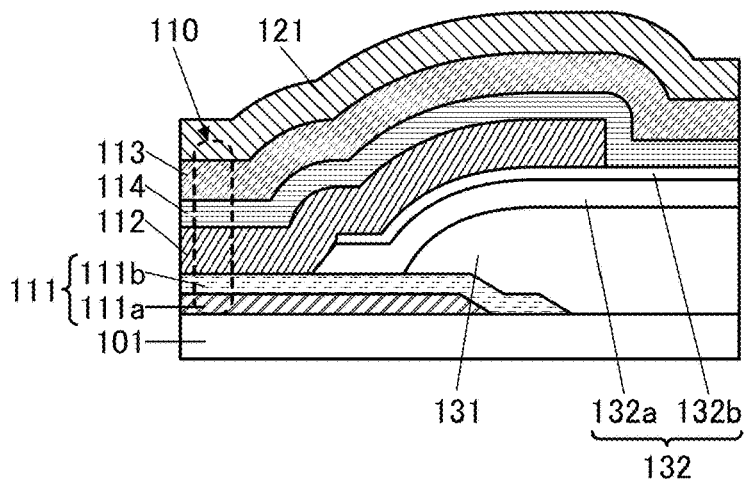

FIG. 4A to FIG. 4C illustrate cross sections of the insulating layer 131 and the insulating layer 132 in the vicinity of the end portions on the light-emitting element 110 side. The light-emitting element 110 includes the pixel electrode 111, the EL layer 112, the EL layer 114, the common electrode 113, and the like. The light-emitting element 110 is either the above light-emitting element 110P or the above light-emitting element 110Q.

FIG. 4A illustrates an example in which the pixel electrode 111 has a stacked-layer structure. In the pixel electrode 111, a conductive layer 111a and a conductive layer 111b are stacked from a substrate 101 side.

Here, an example in which the conductive layer 111b is provided to cover an end portion of the conductive layer 111a is illustrated. Thus, a surface of the conductive layer 111a can be protected by the conductive layer 111b.

For the conductive layer 111a, a film having a reflective property with respect to light emitted by the EL layer 112 can be used. On the other hand, for the conductive layer 111b, a film having a transmitting property with respect to the light can be used.

For the conductive layer 111a, for example, a metal film or an alloy film can be used. A metal film having a high reflective property with respect to visible light, such as a film of aluminum or silver, or an alloy film of them is preferably used for the conductive layer 111a, in which case the light extraction efficiency of the light-emitting element 110 can be increased.

For the conductive layer 111b, a conductive material having a light-transmitting property with respect to visible light can be used. For example, conductive oxide such as indium oxide, indium tin oxide, indium zinc oxide, indium tin oxide containing silicon, or indium zinc oxide containing silicon can be used.

FIG. 4B and FIG. 4C illustrate examples in which the insulating layer 132 has a stacked-layer structure. The insulating layer 132 has a stacked-layer structure in which an insulating layer 132a and an insulating layer 132b are stacked from the substrate 101 side.

In FIG. 4B, the insulating layer 132b is thicker than the insulating layer 132a. In this case, it is preferable that the taper angle of the insulating layer 132b be smaller than the taper angle of the insulating layer 132a.

In contrast, in FIG. 4C, the insulating layer 132a is thicker than the insulating layer 132b. In this case, it is preferable that the taper angle of the insulating layer 132a be smaller than the taper angle of the insulating layer 132b.

As described above, in the case where the insulating layer 132 has a stacked-layer structure, the step coverage with the EL layer 112 can be improved by making the thicker film have a smaller taper angle.

Note that without being limited to the above, the taper angle of the thinner film may be smaller than that of the thicker film. The insulating layer 132 may have a stacked-layer structure of three or more layers.

Fabrication Method Example

Figures 5A, 5B, 5C, 5D, 5E, 5F, 5G:
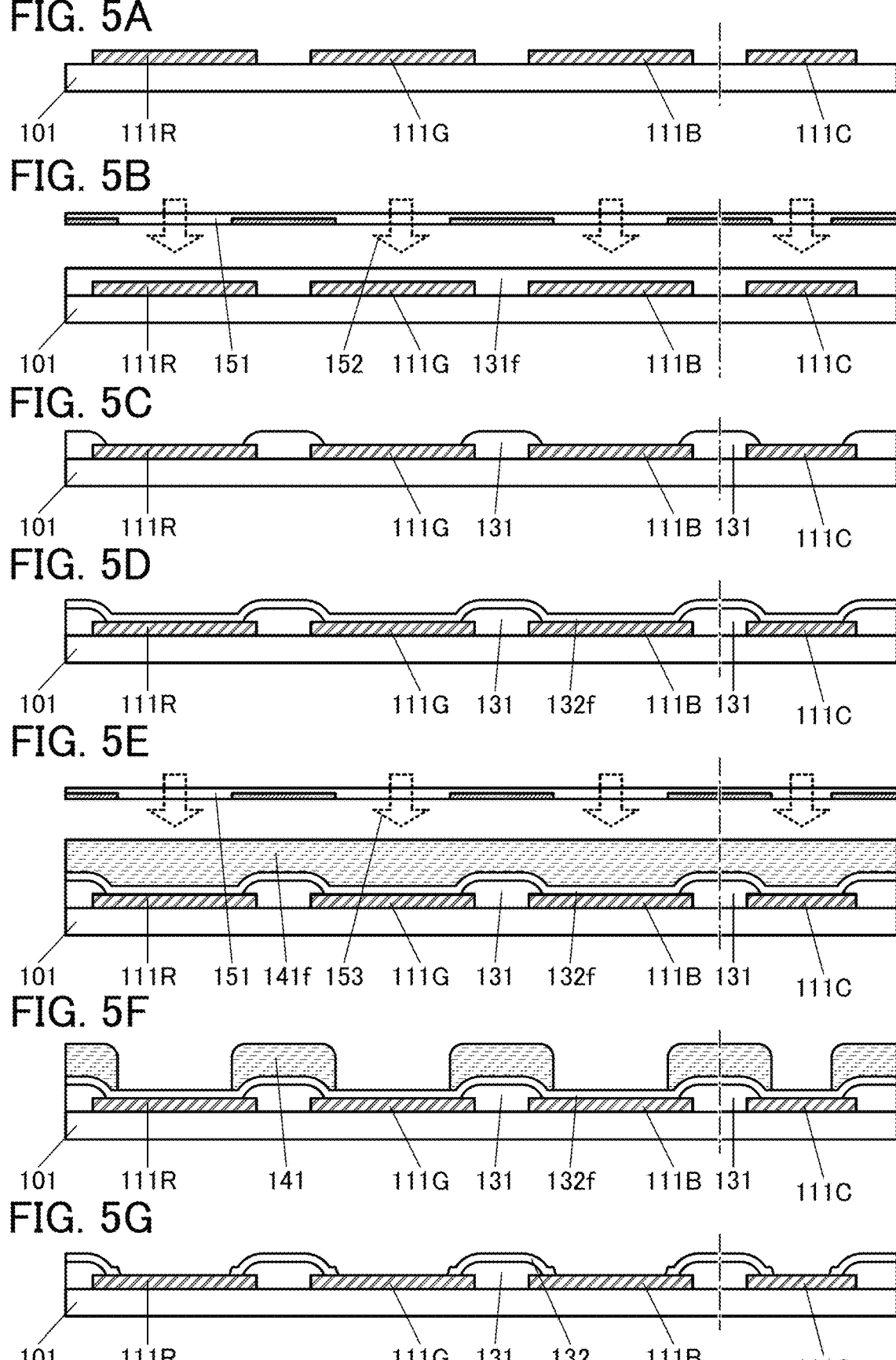
FIG. 5A to FIG. 5G are diagrams illustrating an example of a fabricating method of a display device.

An example of a fabrication method of the display device of one embodiment of the present invention will be described below with reference to drawings. Here, description is made using the display device 100 described in the above structure example as an example. FIG. 5A to FIG. 8C are schematic cross-sectional views in steps of the fabrication method of the display device described below as an example. In FIG. 5A and the like, the schematic cross-sectional views of the connection portion 130 and the vicinity thereof are also illustrated on the right side.

Note that thin films included in the display device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. An example of the thermal CVD method is a metal organic chemical vapor deposition (MOCVD: Metal Organic CVD) method.

Alternatively, thin films included in the display device (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, and a knife coater.

The thin films included in the display device can be processed by a photolithography method or the like. Besides, a nanoimprinting method, a sandblasting method, a lift-off method, or the like may be used for the processing of the thin films. Alternatively, island-shaped thin films may be directly formed by a deposition method using a shielding mask such as a metal mask.

There are the following two typical methods of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

For light used for light exposure in a photolithography method, for example, it is possible to use light with the i-line (wavelength: 365 nm), light with the g-line (wavelength: 436 nm), light with the h-line (wavelength: 405 nm), or combined light of any of them. Alternatively, ultraviolet light, KrF laser light, ArF laser light, or the like can be used. Light exposure may be performed by liquid immersion exposure technique. For light used for the light exposure, extreme ultraviolet (EUV) light, X-rays, or the like may be used. Furthermore, instead of light used for the light exposure, an electron beam can also be used. It is preferable to use extreme ultraviolet light, X-rays, or an electron beam because extremely minute processing can be performed. Note that a photomask is not needed when light exposure is performed by scanning with a beam such as an electron beam.

For etching of the thin film, a dry etching method, a wet etching method, a sandblast method, or the like can be used.

[Preparation for Substrate 101]

For the substrate 101, a substrate having at least heat resistance high enough to withstand the following heat treatment can be used. In the case where an insulating substrate is used for the substrate 101, a glass substrate, a quartz substrate, a sapphire substrate, a ceramic substrate, an organic resin substrate, or the like can be used. Alternatively, a single crystal semiconductor substrate or a polycrystalline semiconductor substrate using silicon or silicon carbide as a material, a compound semiconductor substrate of silicon germanium or the like, or a semiconductor substrate such as an SOI substrate can be used.

For the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrodes 111R, 111G, and 111B and Connection Electrode 111C]

Next, the pixel electrode 111R, the pixel electrode 111G, the pixel electrode 111B, and the connection electrode 111C are formed over the substrate 101 (FIG. 5A). First, a conductive film to be the pixel electrodes is deposited, a resist mask is formed by a photolithography method, and an unnecessary portion of the conductive film is removed by etching. After that, the resist mask is removed, whereby the pixel electrode 111R, the pixel electrode 111G, and the pixel electrode 111B are formed.

In the case where a conductive film having a reflective property with respect to visible light is used for each pixel electrode, it is preferable to use a material (e.g., silver or aluminum) having reflectance as high as possible in the whole wavelength range of visible light. This can increase color reproducibility as well as light extraction efficiency of the light-emitting elements.

[Formation of Insulating Layer 131]

Next, an insulating film 131f is deposited to cover the pixel electrode 111R, the pixel electrode 111G, and the pixel electrode 111B. For the insulating film 131f, a film containing a photosensitive organic resin can be used.

The insulating film 131f can be formed by a wet deposition method such as a spin coating method or an inkjet method. After the deposition, heat treatment is performed to volatilize the solvent in the material. Alternatively, the material may be cured by the heat treatment.

After the deposition of the insulating film 131f, light 152 is irradiated with the use of a photomask 151. Here, an example in which what is called a positive type photosensitive material, whose solubility in a developing solution is improved by light exposure, is used for the insulating film 131f is described.

Then, development treatment is performed to form the insulating layer 131 (FIG. 5C).

In this case, the insulating layer 131 is preferably formed to have a pattern width smaller than the pattern width of a mask pattern of the photomask 151 by adjusting an light exposure time and an intensity of light exposure in light exposure treatment. For example, light exposure is performed under conditions where the amount of light exposure is larger than the proper value.

[Formation of Insulating Layer 132]

Next, an insulating film 132f is deposited to cover the insulating layer 131, the pixel electrode 111R, the pixel electrode 111G, the pixel electrode 111B, and the like (FIG. 5D).

The insulating film 132f can be formed by a deposition method such as an ALD method, a sputtering method, a CVD method, a PLD method, or an evaporation method or a combination of these methods.

Next, a resist film 141f is deposited over the insulating film 132f. Next, the resist film 141f is irradiated with light 153 with the use of the photomask 151 (FIG. 5E).

Subsequently, the resist film 141f is subjected to development treatment to form a resist mask 141 (FIG. 5F).

Here, the photomask 151 can be used as the photomask used for forming the insulating layer 131 and as the photomask used for forming the resist mask 141. Note that exactly the same photomask is not necessarily used; a photomask fabricated for forming the same pattern can be used. Since the photomask 151 can be used in the formation of the insulating layer 131 and in the formation of the resist mask 141, the fabricating cost can be reduced.

Note that the photomask used for forming the insulating layer 131 may be different from the photomask used for forming the resist mask 141.

As illustrated in FIG. 5F, the resist mask 141 is preferably formed to cover the insulating layer 131.

Next, a portion of the insulating film 132f that is not covered by the resist mask 141 is etched. After that, the resist mask 141 is removed. In this manner, the insulating layer 132 is formed (FIG. 5G).

[Formation of EL Film 112Rf]

Subsequently, an EL film 112Rf to be the EL layer 112R later is deposited over the pixel electrode 111R, the pixel electrode 111G, the pixel electrode 111B, and the insulating layer 132.

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, an evaporation method, a sputtering method, or an inkjet method. Without limitation to this, the above-described deposition method can be used as appropriate.

As an example, the EL film 112Rf is preferably a stacked film in which a hole-injection layer, a hole-transport layer, a light-emitting layer, and an electron-transport layer are stacked in this order. In that case, a film including the electron-injection layer can be used for the EL layer 114 formed later. Specifically, the electron-transport layer is provided to cover the light-emitting layer, which can inhibit the light-emitting layer from being damaged in a subsequent photolithography step or the like, so that a highly reliable light-emitting element can be fabricated. Furthermore, layers containing the same organic compound are used for the electron-transport layer used for the EL layer 112Rf and the like and the electron-injection layer used for the EL layer 114 formed later to make their bond favorable, so that a highly reliable light-emitting element with high luminous efficiency can be achieved. For example, an electron-transport organic compound can be used for the electron-transport layer and a material containing the organic compound and a metal can be used for the electron-injection layer.

The EL film 112Rf is preferably formed not to be over the connection electrode 111C. For example, in the case where the EL film 112Rf is formed by an evaporation method or a sputtered method, it is preferable that the EL film 112Rf be formed using a shielding mask not to be deposited over the connection electrode 111C.

[Formation of Sacrificial Film 144a]

Next, a sacrificial film 144a is formed to cover the EL film 112Rf. The sacrificial film 144a is provided in contact with the top surface of the connection electrode 111C.

For the sacrificial film 144a, it is possible to use a film highly resistant to etching treatment performed on various EL films such as the EL film 112Rf, i.e., a film having high etching selectivity. Furthermore, for the sacrificial film 144a, it is possible to use a film having high etching selectivity with respect to a sacrificial film such as a sacrificial film 146a described later. Moreover, for the sacrificial film 144a, it is particularly preferable to use a film that can be removed by a wet etching method less likely to cause damage to EL films.

For the sacrificial film 144a, for example, an inorganic film such as a metal film, an alloy film, a metal oxide film, a semiconductor film, or an inorganic insulating film can be suitably used. The sacrificial film 144a can be formed by any of a variety of deposition methods such as a sputtering method, an evaporation method, a CVD method, and an ALD method. Specifically, the sacrificial film 144a, which is directly formed on the EL film 112Rf, is preferably formed by an ALD method that gives less deposition damage to a formation layer.

For the sacrificial film 144a, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used. It is particularly preferable to use a low-melting-point material such as aluminum or silver.

Alternatively, for the sacrificial film 144a, a metal oxide such as an indium gallium zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon or the like can also be used.

Note that an element M (M is one or more kinds of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. Specifically, M is preferably one or more kinds of gallium, aluminum, and yttrium.

Alternatively, for the sacrificial film 144a, oxide such as aluminum oxide, hafnium oxide, or silicon oxide, nitride such as silicon nitride or aluminum nitride, or oxynitride such as silicon oxynitride can be used. Such an inorganic insulating material can be formed by a deposition method such as a sputtering method, a CVD method, or an ALD method; the sacrificial film 144a, which is formed directly on the EL film 112Rf, is particularly preferably formed by an ALD method.

Alternatively, as the sacrificial film 144a, a material that can be dissolved in a solvent chemically stable with respect to at least the uppermost film of the EL film 112Rf. Specifically, a material that can be dissolved in water or alcohol can be suitably used for the sacrificial film 144*a*. In deposition of the sacrificial film 144*a*, it is preferable that application of such a material dissolved in a solvent such as water or alcohol be performed by a wet deposition process and then heat treatment for evaporating the solvent be performed. In that case, the heat treatment is preferably performed in a reduced-pressure atmosphere, in which case the solvent can be removed at a low temperature in a short time, so that thermal damage to the EL film 112Rf can be reduced.

Examples of the wet deposition processes that can be used for formation of the sacrificial film 144*a* include spin coating, dipping, spray coating, ink-jetting, dispensing, screen printing, offset printing, a doctor knife method, slit coating, roll coating, curtain coating, and knife coating.

For the sacrificial film 144*a*, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Sacrificial Film 146*a*]

Figures 6A, 6B, 6C, 6D, 6E, 6F:
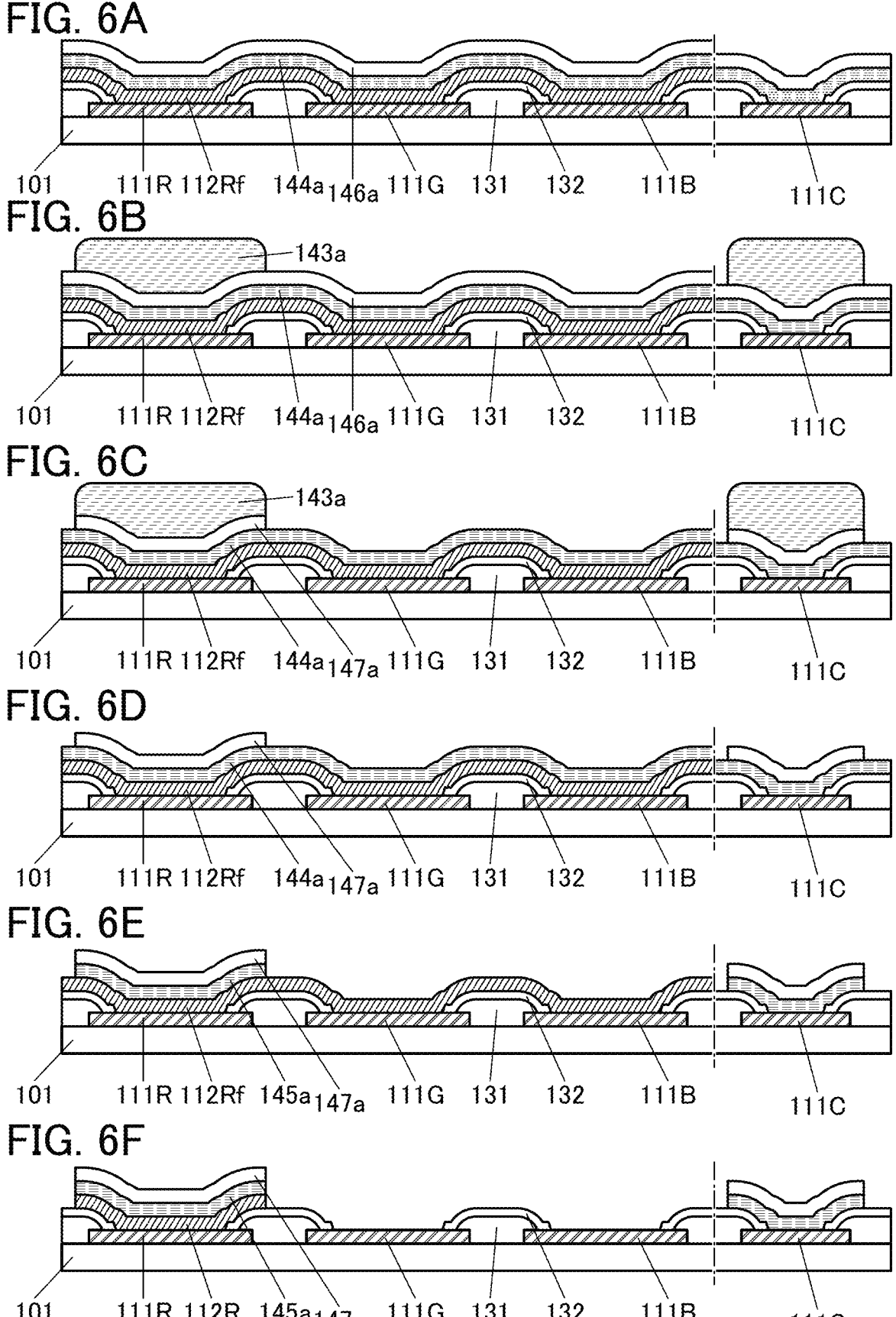
FIG. 6A to FIG. 6F are diagrams illustrating an example of a fabrication method of a display device.

Next, the sacrificial film 146*a* is formed over the sacrificial film 144*a* (FIG. 6A).

The sacrificial film 146*a* is a film used for a hard mask when the sacrificial film 144*a* is etched later. In a later step of processing the sacrificial film 146*a*, the sacrificial film 144*a* is exposed. Thus, the combination of films having high etching selectivity therebetween is selected for the sacrificial film 144*a* and the sacrificial film 146*a*. It is thus possible to select a film that can be used for the sacrificial film 146*a* depending on an etching condition of the sacrificial film 144*a* and an etching condition of the sacrificial film 146*a*.

For example, in the case where dry etching using a gas containing fluorine (also referred to as a fluorine-based gas) is performed as the etching of the sacrificial film 146*a*, silicon, silicon nitride, silicon oxide, tungsten, titanium, molybdenum, tantalum, tantalum nitride, an alloy containing molybdenum and niobium, an alloy containing molybdenum and tungsten, or the like can be used for the sacrificial film 146*a*. Here, examples of films having high etching selectivity to the sacrificial layer 146*a* (that is, enabling low etching rate) in dry etching using the fluorine-based gas include a metal oxide film such as IGZO or ITO and such a film can be used for the sacrificial film 144*a*.

Without being limited to the above, a material of the sacrificial film 146*a* can be selected from a variety of materials depending on an etching condition of the sacrificial film 144*a* and an etching condition of the sacrificial film 146*a*. For example, any of the films that can be used for the sacrificial film 144*a* can also be used.

For example, for the sacrificial film 146*a*, an oxide film can be used. Typically, film of oxide or oxynitride such as silicon oxide, silicon oxynitride, aluminum oxide, aluminum oxynitride, hafnium oxide, or hafnium oxynitride can also be used.

For the sacrificial film 146*a*, a film of nitride can be used, for example. Specifically, it is possible to use a film of nitride such as silicon nitride, aluminum nitride, hafnium nitride, titanium nitride, tantalum nitride, tungsten nitride, gallium nitride, or germanium nitride.

For example, it is preferable that an inorganic insulating material such as aluminum oxide, hafnium oxide, or silicon oxide formed by an ALD method be used for the sacrificial film 144*a*, and a metal oxide containing indium such as an indium gallium zinc oxide (an In—Ga—Zn oxide, also referred to as IGZO) formed by a sputtering method be used for the sacrificial film 146*a*.

Alternatively, for the sacrificial film 146*a*, an organic film that can be used for the EL film 112Rf and the like may be used. For example, the organic film that is used for the EL film 112Rf, an EL film 112Gf, or an EL film 112Bf can be used for the sacrificial film 146*a*. The use of such an organic film is preferable, in which case the deposition apparatus for the sacrificial film 146*a* can be used for the EL film 112Rf and the like. In addition, when the EL film 112Rf and the like is etched using a layer to be a sacrificial layer as a mask, the organic film can be removed at the same time, so that the process can be simplified.

[Formation of Resist Mask 143*a*]

Then, a resist mask 143*a* is formed over the sacrificial film 146*a* in a position overlapping with the pixel electrode 111R and in a position overlapping with the connection electrode 111C (FIG. 6B).

For the resist mask 143*a*, a resist material containing a photosensitive resin such as a positive type resist material or a negative type resist material can be used.

Here, in the case where the sacrificial film 146*a* is not provided and the resist mask 143*a* is formed over the sacrificial film 144*a*, if a defect such as a pinhole exists in the sacrificial film 144*a*, there is a risk of dissolving the EL film 112Rf due to a solvent of the resist material. Such a defect can be prevented by using the sacrificial film 146*a*.

Note that in the case where a film in which a defect such as a pinhole is unlikely to be generated is used for the sacrificial film 144*a* or a material which is not dissolved in a solvent of the resist material is used for the EL film 112Rf, the resist mask 143*a* may be formed directly over the sacrificial film 144*a* without using the sacrificial film 146*a* in some cases.

[Etching of Sacrificial Film 146*a*]

Next, part of the sacrificial film 146*a* that is not covered by the resist mask 143*a* is removed by etching, so that an island-shaped or band-shaped sacrificial layer 147*a* is formed (FIG. 6C). At the same time, the sacrificial layer 147*a* is formed also over the connection electrode 111C.

In the etching of the sacrificial film 146*a*, an etching condition with high selectively is preferably employed so that the sacrificial film 144*a* is not removed by the etching. Either wet etching or dry etching can be performed for the etching of the sacrificial film 146*a*; with use of dry etching, a reduction in a pattern of the sacrificial film 146*a* can be inhibited.

[Removal of Resist Mask 143*a*]

Next, the resist mask 143*a* is removed (FIG. 6D).

The removal of the resist mask 143*a* can be performed by wet etching or dry etching. It is particularly preferable to perform dry etching (also referred to as plasma ashing) using an oxygen gas as an etching gas to remove the resist mask 143*a*.

In that case, the removal of the resist mask 143*a* is performed in a state where the EL film 112Rf is covered by the sacrificial film 144*a*; thus, the EL film 112Rf is less likely to be affected by the removal. Specifically, when the EL film 112Rf is exposed to oxygen, the electrical characteristics are adversely affected in some cases; therefore, it is preferable that the EL film 112Rf be covered by the sacrificial film 144*a* when etching using an oxygen gas, such as plasma ashing, is performed.

[Etching of Sacrificial Film 144*a*]

Next, part of the sacrificial film 144*a* that is not covered by the sacrificial layer 147*a* is removed by etching using the sacrificial layer 147*a* as a mask, so that an island-shaped or band-shaped sacrificial layer 145*a* is formed (FIG. 6E). At the same time, the sacrificial layer 145a is formed also over the connection electrode 111C.

Either wet etching or dry etching can be performed for the etching of the sacrificial film 144a; the use of dry etching is preferable, in which case a reduction in a pattern can be inhibited.

[Etching of EL Film 112Rf]

Next, part of the EL film 112Rf that is not covered by the sacrificial layer 145a is removed by etching, so that an island-shaped or band-shaped EL layer 112R is formed (FIG. 6F). By the etching of the EL film 112Rf, the top surfaces of the pixel electrode 111G, the pixel electrode 111B, and the insulating layer 132 are exposed.

Specifically, for the etching of the EL film 112Rf, it is preferable to perform dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, $H_2$, and a rare gas such as He. Alternatively, a mixed gas of the above gas and a dilute gas that does not contain oxygen can be used for the etching gas.

Note that etching of the EL film 112Rf is not limited to the above and may be performed by dry etching using another gas or wet etching.

In addition, when dry etching using an oxygen gas or an etching gas containing an oxygen gas is used for the etching of the EL film 112Rf, the etching rate can be increased. Thus, etching under a low-power condition can be performed while the etching rate is kept adequately high; hence, damage due to the etching can be reduced. Furthermore, a defect such as attachment of a reaction product generated at the etching can be inhibited. For example, an etching gas obtained by adding an oxygen gas to the etching gas not containing oxygen as its main component can be used.

The insulating layer 132 is exposed when the EL film 112Rf is etched. Accordingly, it is preferable to use a film highly resistant to etching of the EL film 112Rf (a film not easily etched) for the insulating layer 132. Note that at the time of etching of the EL film 112Rf, an upper portion of the insulating layer 132 is etched and a portion not covered by the EL layer 112R is thinned in some cases.

Note that at the time of etching of the EL film 112Rf, the sacrificial layer 147a may also be etched. The EL film 112Rf and the sacrificial layer 147a are preferably etched by the same treatment because the process can be simplified to reduce the manufacturing cost of the display device.

[Formation of EL Film 112Gf]

Subsequently, the EL film 112Gf to be the EL layer 112G is deposited over the sacrificial layer 147a, the insulating layer 132, the pixel electrode 111G, and the pixel electrode 111B. In this case, similarly to the EL film 112Rf, the EL film 112Gf is preferably not provided over the connection electrode 111C.

The description of the EL film 112Rf can be referred to for the formation method of the EL film 120Gf.

[Formation of Sacrificial Film 144b]

Subsequently, a sacrificial film 144b is formed over the EL film 112Gf. The sacrificial film 144b can be formed in a manner similar to that for the sacrificial film 144a. Specifically, the sacrificial film 144b is preferably formed using the same material as the sacrificial film 144a.

At the same time, the sacrificial film 144a is also formed over the connection electrode 111C to cover the sacrificial layer 147a.

[Formation of Sacrificial Film 146b]

Figures 7A, 7B, 7C, 7D, 7E:
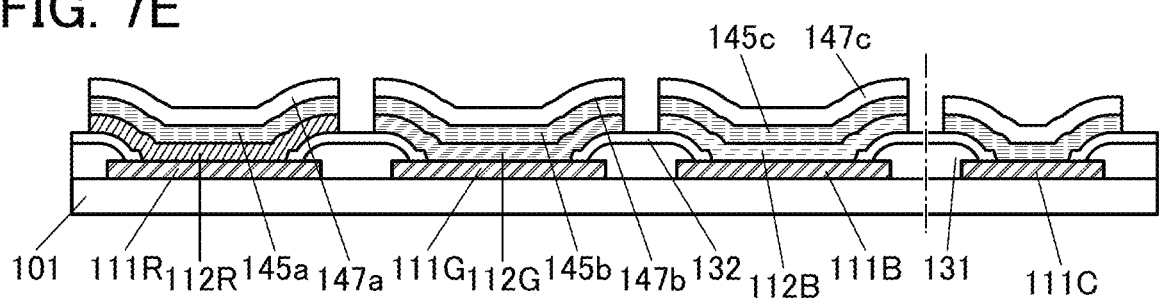
FIG. 7A to FIG. 7E are diagrams illustrating an example of a fabrication method of a display device.

Next, a sacrificial film 146b is formed over the sacrificial film 144b (FIG. 7A). The sacrificial film 146b can be formed in a manner similar to that for the sacrificial film 146a. Specifically, the sacrificial film 146b is preferably formed using the same material as the sacrificial film 146a.

[Formation of Resist Mask 143b]

Next, the resist mask 143b is formed in a region over the sacrificial film 146b and overlapping with the pixel electrode 111G (FIG. 7B).

The resist mask 143b can be formed in a manner similar to that for the resist mask 143a.

Note that here, the connection electrode 111C is protected by the sacrificial layer 145a and the sacrificial layer 147a; thus, the resist mask 143b is not necessarily formed. Note that the resist mask 143b may be provided to cover the connection electrode 111C.

The resist mask 143b can be formed in a manner similar to that for the resist mask 143a.

[Etching of Sacrificial Film 146b]

Next, part of the sacrificial film 146b that is not covered by the resist mask 143b is removed by etching, so that an island-shaped or band-shaped sacrificial layer 147b is formed (FIG. 7C). At the same time, the sacrificial film 146b over the connection electrode 111C is also removed by the etching.

The description of the sacrificial film 146a can be referred to for the etching of the sacrificial film 146b.

[Removal of Resist Mask 143b]

Next, the resist mask 143b is removed. The description of the resist mask 143a can be referred to for the removal of the resist mask 143b.

[Etching of Sacrificial Film 144b]

Next, part of the sacrificial film 144b that is not covered by the sacrificial layer 147b is removed by etching using the sacrificial layer 147b as a mask, so that an island-shaped or band-shaped sacrificial layer 145b is formed. At the same time, the sacrificial film 144b over the connection electrode 111C is also removed by the etching.

The description of the sacrificial film 144a can be referred to for the etching of the sacrificial film 144b.

[Etching of EL Film 112Gf]

Next, part of the EL film 112Gf that is not covered by the sacrificial layer 145b is removed by etching, so that the island-shaped or band-shaped EL layer 112G is formed (FIG. 7D).

The description of the EL film 112Rf can be referred to for the etching of the EL film 112Gf.

In that case, since the EL layer 112R and the connection electrode 111C are protected by the sacrificial layer 145a and the sacrificial layer 147a, the EL layer 112R and the connection electrode 111C can be prevented from being damaged in the step of etching the EL film 112Gf.

In this manner, the island-shaped or band-shaped EL layer 112R and the island-shaped or band-shaped EL layer 112G can be separately formed with high alignment accuracy.

[Formation of EL Layer 112B]

The above steps are performed on the EL film 112Bf (not illustrated), whereby the EL layer 112B, a sacrificial layer 145c, and a sacrificial layer 147c which have an island shape or band-like shape can be formed (FIG. 7E).

That is, after the EL layer 112G is formed, the EL film 112Bf, a sacrificial film 144c, a sacrificial film 146c, and a resist mask 143c (each of which is not illustrated) are formed in this order. Next, the sacrificial film 146c is etched to form the sacrificial layer 147c (not illustrated); then, the resist mask 143c is removed. Subsequently, the sacrificial film 144c is etched to form the sacrificial layer 145c. After that, the EL film 112Bf is etched to form the EL layer 112B which has an island shape or band-like shape.

[Removal of Sacrificial Layers]

Next, the sacrificial layer 147a, the sacrificial layer 147b, the sacrificial layer 147c, the sacrificial layer 145a, the sacrificial layer 145b, and the sacrificial layer 145c are removed to expose the top surfaces of the EL layer 112R, the EL layer 112G, and the EL layer 112B (FIG. 8A). At the same time, the top surface of the connection electrode 111C is also exposed.

Etching of the sacrificial layer 147a, the sacrificial layer 147b, and the sacrificial layer 147c (hereinafter, collectively referred to as a sacrificial layer 147) and etching of the sacrificial layer 145a, the sacrificial layer 145b, and the sacrificial layer 145c (hereinafter, collectively referred to as a sacrificial layer 145) are preferably performed in the same step.

Note that the etching of the sacrificial layer 147 and the etching of the sacrificial layer 145 may be performed in different steps. In that case, the sacrificial layer 147 is etched and then the sacrificial layer 145 is etched.

Alternatively, the sacrificial layer 145 may be etched by isotropic etching (e.g., wet etching) to lift off the sacrificial layer 147.

The sacrificial layer 145 and the sacrificial layer 147 can be removed by wet etching or dry etching. In that case, a method that causes damage to the EL layer 112R, the EL layer 112G, and the EL layer 112B as little as possible is preferably employed. Specifically, a wet etching method is preferably used. For example, wet etching using diluted hydrofluoric acid, oxalic acid, phosphoric acid, acetic acid, nitric acid, a mixed solution thereof, or a tetramethyl ammonium hydroxide (TMAH) solution is preferably performed.

Alternatively, one or both of the sacrificial layer 145 and the sacrificial layer 147 are preferably removed by being dissolved in a solvent such as water or alcohol. For the alcohol in which the sacrificial layer 145 or the sacrificial layer 147 can be dissolved, any of various alcohols such as ethyl alcohol, methyl alcohol, isopropyl alcohol (IPA), and glycerin can be used.

After the sacrificial layer 145 and the sacrificial layer 147 are removed, drying treatment is preferably performed to remove water contained in the EL layer 112R, the EL layer 112G, and the EL layer 112B and water adsorbed on the surfaces thereof. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

In this manner, the EL layer 112R, the EL layer 112G, and the EL layer 112B can be separately formed.

[Formation of EL Layer 114]

Next, the EL layer 114 is deposited to cover the EL layer 112R, the EL layer 112G, and the EL layer 112B.

The EL layer 114 can be deposited in a manner similar to that for the EL film 112Rf and the like. In the case where the EL layer 114 is deposited by an evaporation method, the EL layer 114 is preferably deposited using a shielding mask not to be deposited over the connection electrode 111C.

[Formation of Common Electrode 113]

Then, the common electrode 113 is formed to cover the EL layer 114 and the connection electrode 111C (FIG. 8B).

The common electrode 113 can be formed by a deposition method such as an evaporation method or a sputtering method. Alternatively, a film formed by an evaporation method and a film formed by a sputtering method may be stacked. In that case, the common electrode 113 is preferably formed to cover a region where the EL layer 114 is formed. That is, a structure in which an end portion of the EL layer 114 overlaps with the common electrode 113 can be employed. The common electrode 113 is preferably formed using a shielding mask.

The common electrode 113 is electrically connected to the connection electrode 11 IC outside a display region.

[Formation of Protective Layer 121]

Next, the protective layer 121 is formed over the common electrode 113. An inorganic insulating film used for the protective layer 121 is preferably deposited by a sputtering method, a PECVD method, or an ALD method. Specifically, an ALD method is preferable because it provides excellent step coverage and is less likely to cause a defect such as a pinhole. An organic insulating film is preferably deposited by an inkjet method because a uniform film can be formed in a desired area.

In this manner, the display device 100 illustrated in FIG. 1B and FIG. 1C can be fabricated.

Although the case where the common electrode 113 and the EL layer 114 are formed to have different top surface shapes is described in the above, they may be formed in the same region.

Figure 9A:
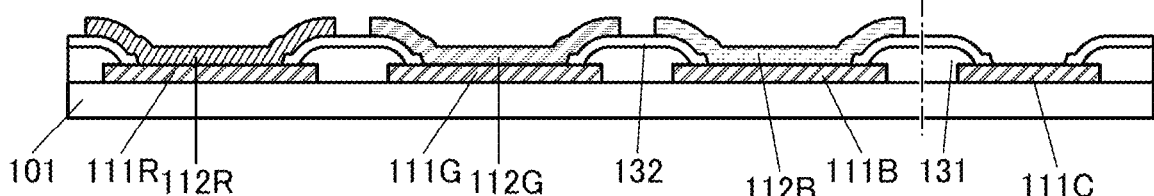
FIG. 9A to FIG. 9C are diagrams illustrating an example of a fabrication method of a display device.
Figure 9B:
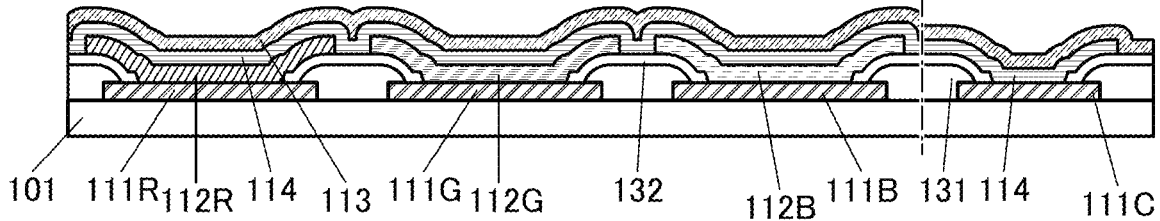

FIG. 9A is a schematic cross-sectional view after removal of the sacrificial layers in the above-described structure. Next, as illustrated in FIG. 9B, the EL layer 114 and the common electrode 113 are formed using the same shielding mask or without a shielding mask. Thus, manufacturing cost can be reduced compared to the case where different shielding masks are used.

In this case, as illustrated in FIG. 9B, the connection portion 130 has a structure in which EL layer 114 is sandwiched between the connection electrode 111C and the common electrode 113. In this case, for the EL layer 114, a material with as low electric resistance as possible is preferably used. Alternatively, it is preferable to form the EL layer 114 as thin as possible, in which case the electric resistance of the EL layer 114 in the thickness direction is reduced. For example, when a material which has an electron-injection property or a hole-injection property and whose thickness is greater than or equal to 1 nm and less than or equal to 5 nm, preferably greater than or equal to 1 nm and less than or equal to 3 nm is used for the EL layer 114, the electric resistance between the connection electrode 111C and the common electrode 113 can be made small enough to be negligible in some cases.

Figure 9C:
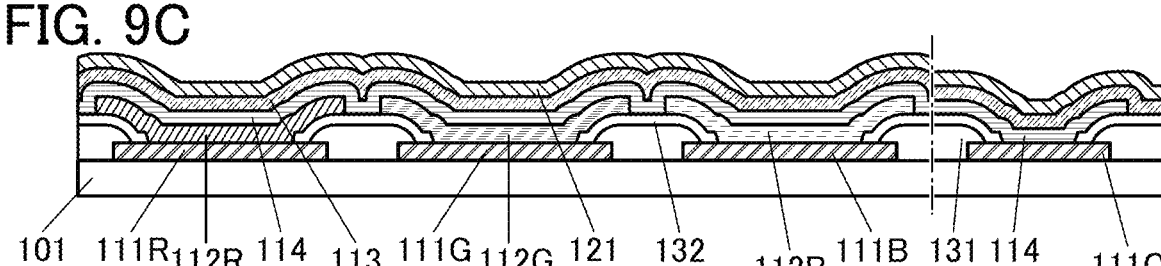

Next, as illustrated in FIG. 9C, the protective layer 121 is formed. In this case, as illustrated in FIG. 9C, the protective layer 121 is preferably provided to cover an end portion of the common electrode 113 and the end portion of the EL layer 114. Accordingly, diffusion of impurities such as water or oxygen from the outside into the EL layer 114 and the interface between the EL layer 114 and the common electrode 113 can be effectively prevented.

The above is the description of the example of the fabrication method of a display device.

MODIFICATION EXAMPLE

An example whose structure is partly different from that of the above-described example is described below. Note that hereinafter, the above description can be referred to for portions similar to those described above, and the description is not repeated in some cases.

Modification Example 1

Figure 10A:
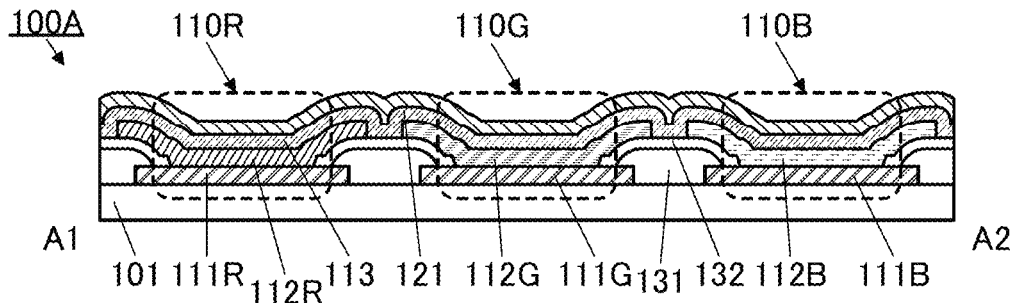
FIG. 10A to FIG. 10C are diagrams illustrating structure examples of display devices.
Figure 10B:
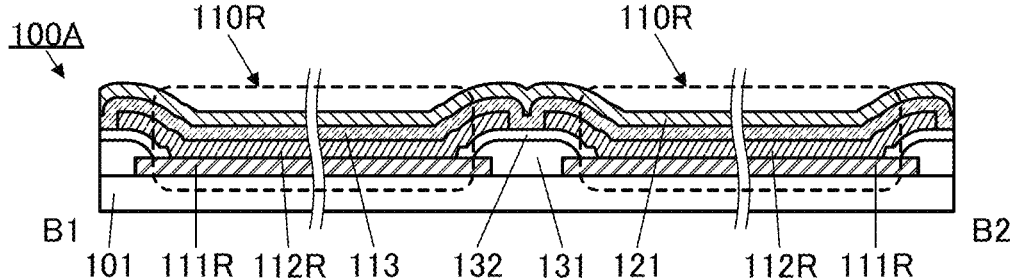

FIG. 10A and FIG. 10B are schematic cross-sectional views of a display device 100A. A top view of the display device 100A is similar to that in FIG. 1A. FIG. 10A corresponds to a cross section taken along the X direction, and FIG. 8B corresponds to a cross section taken along the Y direction.

The display device 100A is different from the display device 100 mainly in not including the EL layer 114 that is a common layer.

The common electrode 113 is provided to be in contact with the top surfaces of the EL layer 112R, the EL layer 112G, and the EL layer 112B. When the EL layer 114 is not provided, the light-emitting element 110R, the light-emitting element 110G, and the light-emitting element 110B can have totally different stacked structures, so that more choices for materials are given; thus, the design flexibility can be increased.

Figure 10C:
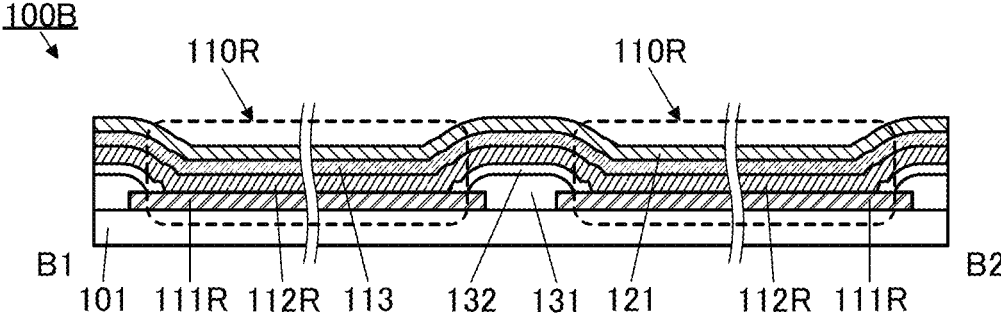

A display device 100B illustrated in FIG. 10C is an example in which the EL layers and the common electrode 113 are processed to be continuous without separation between light-emitting elements of the same color arranged in the Y direction. That is, in the display device 100B, the EL layers and the common electrode 113 are processed to have the top surfaces in a band-like shape.

Modification Example 2

Figure 11A:
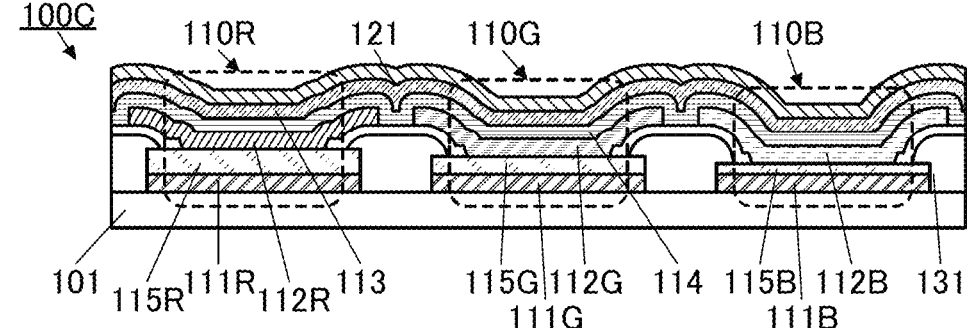
FIG. 11A to FIG. 11C are diagrams illustrating structure examples of display devices.
Figure 11B:
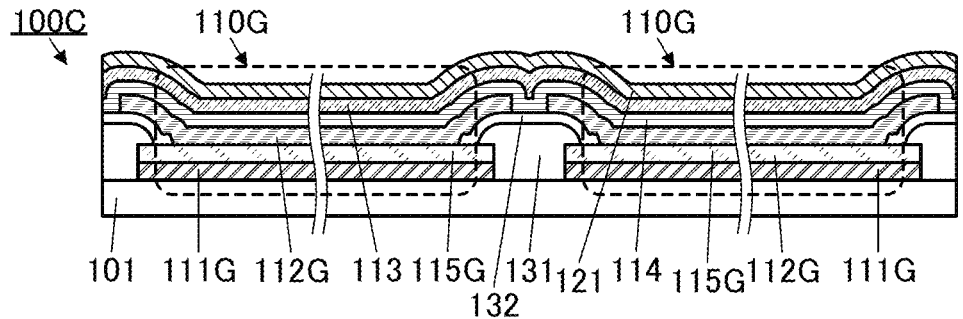

A display device 100C illustrated in FIG. 11A and FIG. 11B is different from the display device 100 and the like mainly in the structure of the light-emitting elements.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

The optical adjustment layer 115R, the optical adjustment layer 115G, and the optical adjustment layer 115B each correspond to the conductive layer 111b illustrated in FIG. 4A and the like. In this case, the pixel electrode 111R, the pixel electrode 111G, and the pixel electrode 111B each correspond to the conductive layer 111a.

Moreover, the optical adjustment layer 115R, the optical adjustment layer 115G, and the optical adjustment layer 115B each have a light-transmitting property with respect to visible light. The optical adjustment layer 115R, the optical adjustment layer 115G, and the optical adjustment layer 115B have different thicknesses. Thus, the optical path lengths of the light-emitting elements can differ from one another.

Here, a conductive film having a reflecting property with respect to visible light is used for the pixel electrode 111R, the pixel electrode 111G, and the pixel electrode 111B, and a conductive film having a reflecting property and a transmitting property with respect to visible light is used for the common electrode 113. Thus, the light-emitting elements each have what is called a microcavity structure and light with a specific wavelength is intensified. Hence, a display device in which the color purity is enhanced can be achieved.

A conductive material having a light-transmitting property with respect to visible light can be used for each of the optical adjustment layers. For example, a conductive oxide such as indium oxide, indium tin oxide, indium zinc oxide, zinc oxide, zinc oxide containing gallium, indium tin oxide containing silicon, or indium zinc oxide containing silicon can be used.

The optical adjustment layers can be formed after the formation of the pixel electrode 111R, the pixel electrode 111G, and the pixel electrode 111B and before the formation of the EL film 112Rf and the like. The optical adjustment layers may be formed using conductive films with different thicknesses from each other or may have a single-layer structure, a two-layer structure, or a three-layer structure, in ascending order of thickness.

Figure 11C:
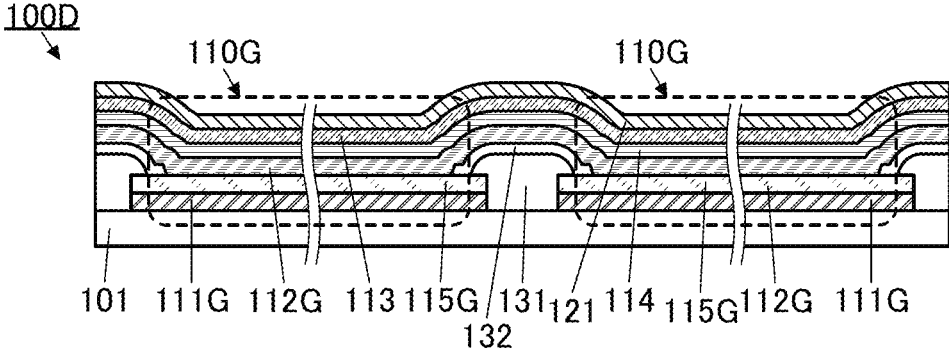

A display device 100D illustrated in FIG. 11C is an example in which an EL layer and the common electrode 113 that each have a band-like shape and extend in the Y direction are employed for the display device 100C. FIG. 11C illustrates a cross section of the two light-emitting elements 110G placed side by side in the Y direction.

Modification Example 3

Figure 12A:
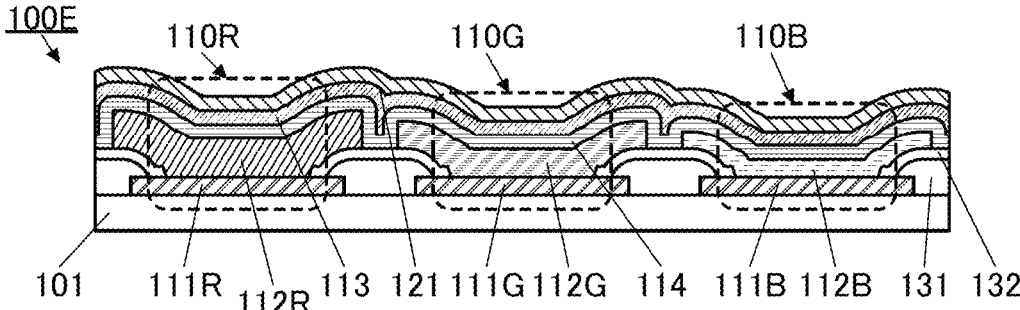
FIG. 12A to FIG. 12C are diagrams illustrating structure examples of display devices.
Figure 12B:
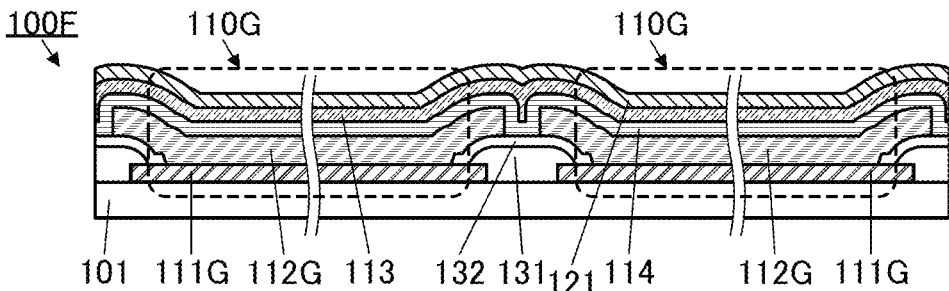

A display device 100E illustrated in FIG. 12A and FIG. 12B is different from the display device 100C mainly in not including an optical adjustment layer.

The display device 100E is an example in which a microcavity structure is achieved with the thicknesses of the EL layer 112R, the EL layer 112G, and the EL layer 112B. Such a structure does not require an optical adjustment layer provided additionally, so that the process can be simplified.

For example, in the display device 100E, the EL layer 112R of the light-emitting element 110R emitting light with the longest wavelength has the largest thickness, and the EL layer 112B of the light-emitting element 110B emitting light with the shortest wavelength has the smallest thickness. Without limitation to this, each of the thicknesses of the EL layers can be adjusted in consideration of the wavelength of light emitted by the light-emitting element, the optical characteristics of the layer included in the light-emitting element, the electrical characteristics of the light-emitting element, and the like.

Figure 12C:
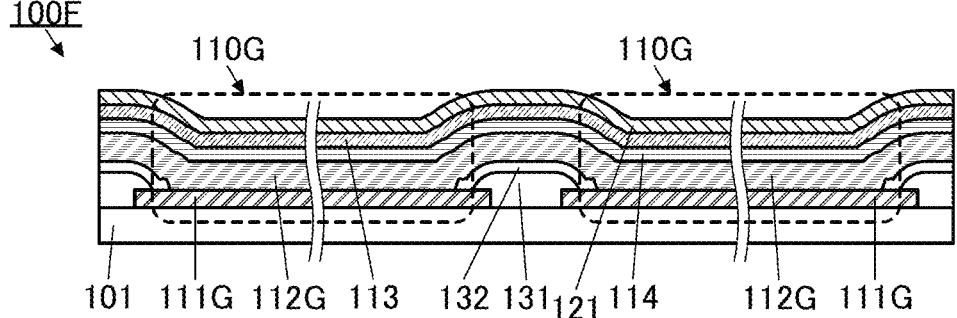

The display device 100F illustrated in FIG. 12C is an example in which an EL layer and the common electrode 113 that have a band-like shape and extend in the Y direction are employed to the display device 100E. FIG. 12C illustrates a cross section of the two light-emitting elements 110G placed side by side in the Y direction.

The above is the description of the variation example.

Note that although the EL layer 114 is used in the examples in Modification Example 2 and Modification Example 3, the EL layer 114 is not necessarily provided.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, structure examples of a display device of one embodiment of the present invention are described.

The display device of this embodiment can be a high-definition display device or a large-sized display device. Accordingly, the display device of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

[Display Device 400A]

Figure 13:
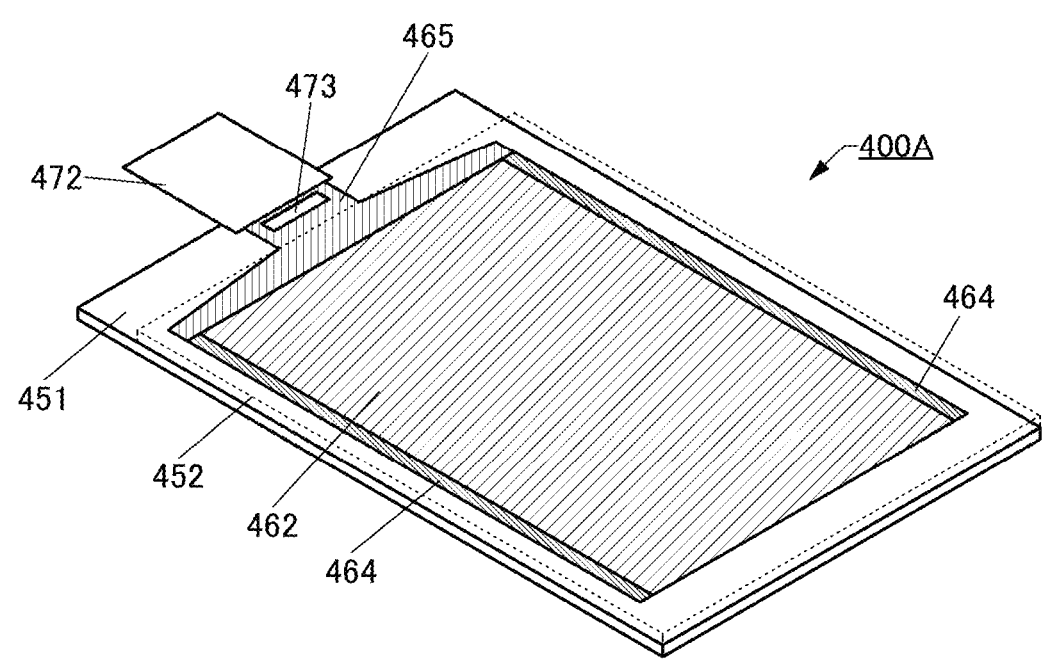
FIG. 13 is a perspective view illustrating an example of a display device.
Figures 14A, 14B:
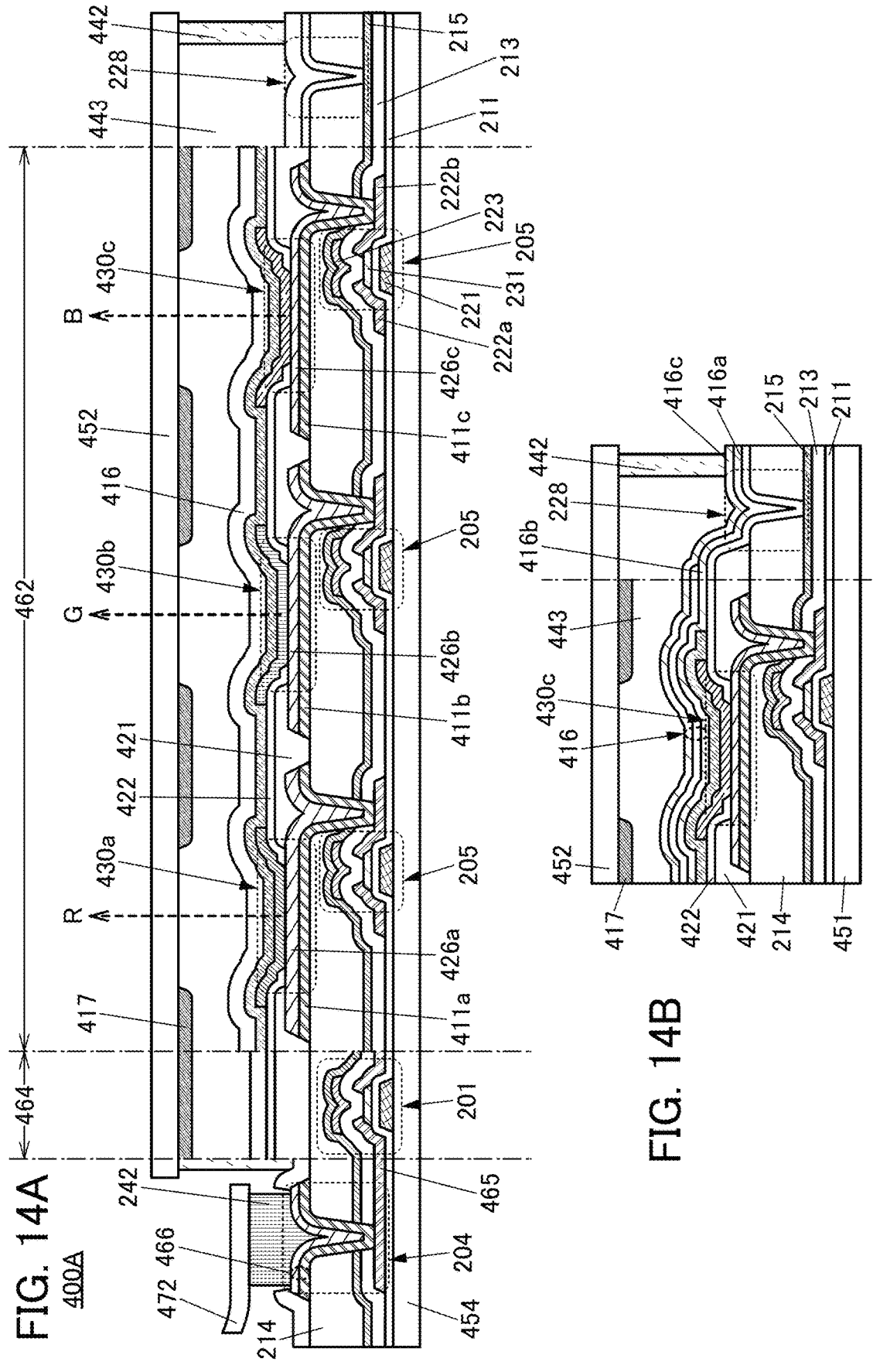
FIG. 14A and FIG. 14B are cross-sectional views illustrating examples of a display device.

FIG. 13 is a perspective view of a display device 400A, and FIG. 14A is a cross-sectional view of the display device 400A.

The display device 400A has a structure in which a substrate 452 and a substrate 451 are bonded to each other. In FIG. 13, the substrate 452 is denoted by a dashed line.

The display device 400A includes a display portion 462, a circuit 464, a wiring 465, and the like. FIG. 13 illustrates an example in which an IC 473 and an FPC 472 are integrated on the display device 400A. Thus, the structure illustrated in FIG. 13 can be regarded as a display module including the display device 400A, the IC (integrated circuit), and the FPC.

For the circuit 464, for example, a scan line driver circuit can be used.

The wiring 465 has a function of supplying a signal and power to the display portion 462 and the circuit 464. The signal and power are input to the wiring 465 from the outside through the FPC 472 or input to the wiring 465 from the IC 473.

FIG. 13 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 14A illustrates an example of cross sections of part of a region including the FPC 472, part of the circuit 464, part of the display portion 462, and part of a region including an end portion in the display device 400A.

The display device 400A illustrated in FIG. 14A includes a transistor 201, a transistor 205, a light-emitting element 430a which emits red light, a light-emitting element 430b which emits green light, a light-emitting element 430c which emits blue light, and the like between the substrate 451 and the substrate 452.

The light-emitting element described in Embodiment 1 can be employed for the light-emitting element 430a, the light-emitting element 430b, and the light-emitting element 430c.

Here, in the case where the pixel of the display device includes three kinds of subpixels including light-emitting elements that emit different colors, as the three subpixels, subpixels of three colors of red (R), green (G), and blue (B), subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given.

A protective layer 416 and the substrate 452 are bonded to each other with an adhesive layer 442 therebetween. A solid sealing structure, a hollow sealing structure, or the like can be employed to seal the light-emitting elements. In FIG. 14A, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting elements. The space 443 surrounded by the substrate 452, the adhesive layer 442, and the substrate 451 may be filled with a resin different from that of the adhesive layer 442.

The light-emitting element 430a, the light-emitting element 430b, and the light-emitting element 430c each have an optical adjustment layer between the pixel electrode and the EL layer. The light-emitting element 430a includes an optical adjustment layer 426a, the light-emitting element 430b includes an optical adjustment layer 426b, and the light-emitting element 430c includes an optical adjustment layer 426c. For details of the light-emitting element, Embodiment 1 can be referred to.

A pixel electrode 411a, a pixel electrode 411b, and a pixel electrode 411c are each connected to a conductive layer 222b included in the transistor 205 through an opening provided in an insulating layer 214.

End portions of the pixel electrode and the optical adjustment layer are covered by an insulating layer 421 and an insulating layer 422. The insulating layer 421 contains an organic resin and the insulating layer 422 includes an inorganic insulating film. The pixel electrode contains a material that reflects visible light, and a counter electrode contains a material that transmits visible light.

Light emitted from the light-emitting element is emitted toward the substrate 452 side. For the substrate 452, a material having a high visible-light-transmitting property is preferably used.

The transistor 201 and the transistor 205 are formed over the substrate 451. These transistors can be fabricated using the same materials in the same steps.

An insulating layer 211, an insulating layer 213, an insulating layer 215, and the insulating layer 214 are provided in this order over the substrate 451. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material through which impurities such as water and hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. For the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display device 400A. This can inhibit entry of impurities from the end portion of the display device 400A through the organic insulating film. Alternatively, the organic insulating film may be formed so that an end portion of the organic insulating film is positioned inward from the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 14A, an opening is formed in the insulating layer 214. This can inhibit entry of impurities into the display portion 462 from the outside through the insulating layer 214 even when an organic insulating film is used as the insulating layer 214. Thus, the reliability of the display device 400A can be increased.

Each of the transistor 201 and the transistors 205 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is sandwiched between two gates is used for the transistor 201 and the transistors 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display device of this embodiment.

The band gap of a metal oxide used for the semiconductor layer of the transistor is preferably 2 eV or more, further preferably 2.5 eV or more. With the use of a metal oxide having a wide bandgap, the off-state current of the OS transistor can be reduced.

A metal oxide contains preferably at least indium or zinc and further preferably indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as In-M-Zn oxide in some cases.

When a metal oxide is an In-M-Zn oxide, the atomic ratio of In is preferably higher than or equal to the atomic ratio of M in the In-M-Zn oxide. Examples of the atomic ratio of metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the proportion of the number of indium atoms in the metal oxide, the on-state current, field-effect mobility, or the like of the transistor can be improved.

For example, when the atomic ratio is described as In:Ga:Zn=4:2:3 or a composition in the neighborhood thereof, the case is included where the content ratio of each element is as follows; Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the content ratio of each element is as follows; Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where the content ratio of each element is as follows; Ga is greater than 0.1 and less than or equal to 2 and Zn is greater than 0.1 and less than or equal to 2 with In being 1.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, In:M:Zn=1:3:4 or a composition in the neighborhood thereof. By increasing the proportion of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

Alternatively, the semiconductor layer of the transistor may include silicon. Examples of silicon include amorphous silicon and crystalline silicon (e.g., low-temperature poly-silicon or single crystal silicon).

Alternatively, a semiconductor layer of a transistor may include a layered material that functions as a semiconductor. The layered substance is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered materials include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

A light-blocking layer 417 is preferably provided on a surface of the substrate 452 on the substrate 451 side. A variety of optical members can be arranged on the outer side of the substrate 452. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorption layer, or the like may be provided on the outer side of the substrate 452.

With provision of the protective layer 416 that covers the light-emitting element, entry of impurities such as water into the light-emitting element can be inhibited, leading to an increase in the reliability of the light-emitting element.

In the region 228 in the vicinity of the end portion of the display device 400A, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. Thus, entry of impurities into the display portion 462 from the outside through an organic insulating film can be inhibited. Thus, the reliability of the display device 400A can be increased.

FIG. 14B illustrates an example in which the protective layer 416 has a three-layer structure. In FIG. 14B, the protective layer 416 includes an inorganic insulating layer 416a over the light-emitting element 430c, an organic insulating layer 416b over the inorganic insulating layer 416a, and an inorganic insulating layer 416c over the organic insulating layer 416b.

The inorganic insulating layer 416a and the inorganic insulating layer 416c extend beyond an end portion of the organic insulating layer 416b and are in contact with each other. The inorganic layer 416a and the insulating layer 422 are in contact with each other in a region where the common electrode is not provided. The inorganic insulating layer 422 is in contact with the insulating layer 215 (inorganic insulating layer) through the opening in the insulating layer 214 (organic insulating layer). Thus, the light-emitting element can be surrounded by the insulating layer 215 and the protective layer 416, so that the reliability of the light-emitting element can be increased.

As described above, the protective layer 416 may have a stacked-layer structure of an organic insulating film and an inorganic insulating film. In that case, the inorganic insulating film preferably extends beyond the organic insulating film.

For each of the substrate 451 and the substrate 452, glass, quartz, ceramic, sapphire, a resin, a metal, an alloy, a semiconductor, or the like can be used. The substrate on the side where light from the light-emitting element is extracted is formed using a material that transmits the light. When a flexible material is used for the substrate 451 and the substrate 452, the flexibility of the display device can be increased. Furthermore, a polarizing plate may be used as the substrate 451 or the substrate 452.

For each of the substrate 451 and the substrate 452, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

For the connection layer 242, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display device, and conductive layers (conductive layers functioning as a pixel electrode or a common electrode) included in the light-emitting element.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 400B]

Figures 15A, 15B:
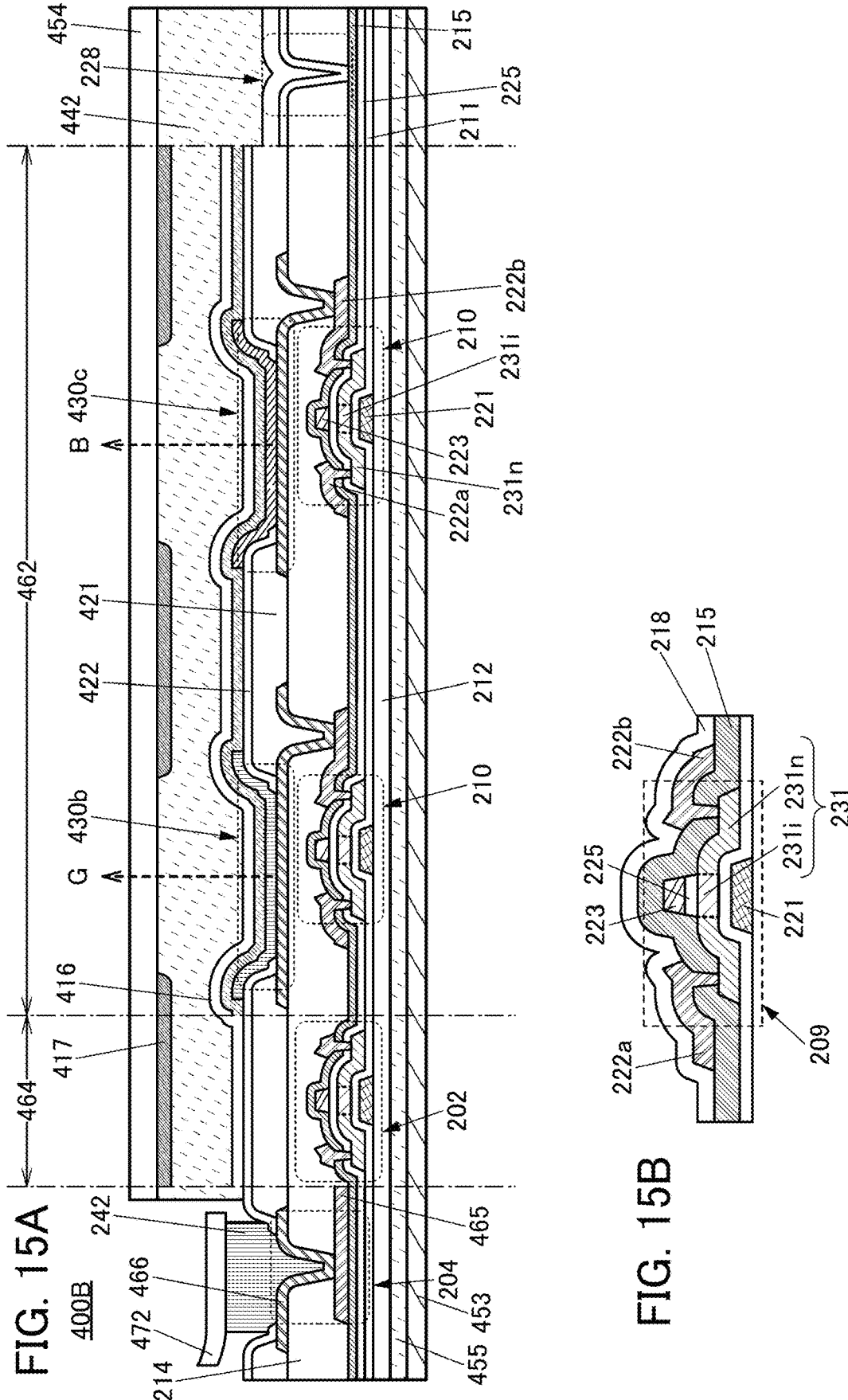
FIG. 15A is a cross-sectional view illustrating an example of a display device.
FIG. 15B is a cross-sectional view illustrating an example of a transistor.

FIG. 15A is a cross-sectional view of a display device 400B. A perspective view of the display device 400B is similar to that of the display device 400A illustrated in FIG. 13. FIG. 15A illustrates an example of a cross section including part of a region including the FPC 472, part of the circuit 464, and part of the display portion 462 in the display device 400B. FIG. 15A specifically illustrates an example of a cross section of a region including the light-emitting element 430b that emits green light and the light-emitting element 430c that emits blue light in the display portion 462. Note that portions similar to those of the display device 400A are not described in some cases.

The display device 400B illustrated in FIG. 15A includes a transistor 202, a transistor 210, the light-emitting element 430c, the light-emitting element 430b, and the like between a substrate 453 and a substrate 454.

The substrate 454 and the protective layer 416 are bonded to each other with the adhesive layer 442. The adhesive layer 442 is provided to overlap with the light-emitting element 430b and the light-emitting element 430c; that is, the display device 400B employs a solid sealing structure.

The substrate 453 and an insulating layer 212 are bonded to each other with an adhesive layer 455.

In a fabricating method of the display device 400B, first, a formation substrate provided with the insulating layer 212, the transistors, the light-emitting elements, and the like is bonded to the substrate 454 provided with the light-blocking layer 417 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display device 400B.

The inorganic insulating film that can be used as the insulating layer 211, the insulating layer 213, and the insulating layer 215 can be used as the insulating layer 212.

The pixel electrode is connected to the conductive layer 222b included in the transistor 210 through an opening provided in the insulating layer 214. The transistor 210 has a function of controlling driving of the light-emitting element.

An end portion of the pixel electrode is covered by the insulating layer 421 and the insulating layer 422.

Light emitted by the light-emitting element 430b and the light-emitting element 430c is emitted toward the substrate 454 side. For the substrate 454, a material having a high transmitting property with respect to visible light is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

Each of the transistor 202 and the transistors 210 includes the conductive layer 221 functioning as a gate, the insulating layer 211 functioning as a gate insulating layer, a semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* functions as a source, and the other functions as a drain.

FIG. 15A illustrates an example in which the insulating layer 225 covers the top surface and the side surface of the semiconductor layer. The conductive layer 222*a* and the conductive layer 222*b* are connected to the corresponding low-resistance regions 231*n* through openings provided in the insulating layer 225 and the insulating layer 215.

Meanwhile, in a transistor 209 illustrated in FIG. 15B, the insulating layer 225 overlaps with the channel formation region 231*i* of the semiconductor layer 231 and does not overlap with the low-resistance regions 231*n*. The structure illustrated in FIG. 15B can be fabricated by processing the insulating layer 225 using the conductive layer 223 as a mask, for example. In FIG. 15B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, light-emitting elements (also referred to as light-emitting devices) that can be used in a display device that is one embodiment of the present invention will be described.

In this specification and the like, a device fabricated using a metal mask or an FMM (fine metal mask) may be referred to as a device having an MM (metal mask) structure. In this specification and the like, a device fabricated without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display device.

Structures of light-emitting devices can be classified roughly into a single structure and a tandem structure. A device with a single structure includes one light-emitting unit between a pair of electrodes, and the light-emitting unit preferably includes one or more light-emitting layers. To obtain white light emission in a single structure, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device with a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission in a tandem structure, the structure is made so that light from light-emitting layers of the plurality of light-emitting units can be combined to be white light. Note that a combination of emission colors for obtaining white light emission is similar to a structure in the case of a single structure. In the device with a tandem structure, an intermediate layer such as a charge-generation layer is suitably provided between the plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Structure Examples of Light-Emitting Element

As illustrated in FIG. 16A, the light-emitting element includes an EL layer 23 between a pair of electrodes (a lower electrode 21 and an upper electrode 25). The EL layer 23 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can function as a single light-emitting unit, and the structure in FIG. 16A is referred to as a single structure in this specification.

FIG. 16B is a modification example of the EL layer 23 included in a light-emitting element 20 illustrated in FIG. 16A. Specifically, the light-emitting element 20 illustrated in FIG. 16B includes a layer 4430-1 over a lower electrode 21, a layer 4430-2 over the layer 4430-1, the light-emitting layer 4411 over the layer 4430-2, a layer 4420-1 over the light-emitting layer 4411, a layer 4420-2 over the layer 4420-1, and an upper electrode 25 over the layer 4420-2. For example, when the lower electrode 21 functions as an anode and the upper electrode 25 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 21 functions as a cathode and the upper electrode 25 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layered structure, carriers can be efficiently injected to the light-emitting layer 4411, and the efficiency of the recombination of carriers in the light-emitting layer 4411 can be enhanced.

Note that the structure in which a plurality of light-emitting layers (light-emitting layers 4411, 4412, and 4413) are provided between the layer 4420 and the layer 4430 as illustrated in FIG. 16C is a variation of the single structure.

The structure in which a plurality of light-emitting units (an EL layer 23a and an EL layer 23b) are connected in series with an intermediate layer (charge-generation layer) 4440 therebetween as illustrated in FIG. 16D is referred to as a tandem structure in this specification. In this specification and the like, the structure illustrated in FIG. 16D is referred to as a tandem structure; however, without being limited to this, a tandem structure may be referred to as a stack structure, for example. The tandem structure enables a light-emitting element capable of high luminance light emission.

In FIG. 16D, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light can be obtained when the light-emitting layer 4411 and the light-emitting layer 4412 emit light of complementary colors.

Also in the structures illustrated in FIG. 16C and FIG. 16D, the layers 4420 and the layers 4430 may each have a stacked-layer structure of two or more layers as illustrated in FIG. 16B.

A structure in which light-emitting elements that emit light of different colors (here, blue (B), green (G), and red (R)) are separately formed is referred to as an SBS (Side By Side) structure in some cases.

The emission color of the light-emitting element can be red, green, blue, cyan, magenta, yellow, white, or the like depending on the material contained in the EL layer 23. Furthermore, the color purity can be further increased when the light-emitting element has a microcavity structure.

The light-emitting element that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer have a relationship of complementary colors, it is possible to obtain a light-emitting element which emits white light as a whole. The same can be applied to a light-emitting element including three or more light-emitting layers.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

Here, a specific structure example of a light-emitting element is described.

The light-emitting element includes at least the light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer in addition to the light-emitting layer.

The hole-injection layer is a layer injecting holes from an anode to the hole-transport layer, and a layer containing a material with a high hole-injection property. For the material with a high hole-injection property, an aromatic amine compound and a composite material containing a hole-transport material and an acceptor material (electron-accepting material), and the like can be given.

The hole-transport layer is a layer transporting holes, which are injected from the anode by the hole-injection layer, to the light-emitting layer. The hole-transport layer is a layer containing a hole-transport material. For the hole-transport material, a substance having a hole mobility greater than or equal to $1\times10^{-6}$ cm²/Vs is preferable. Note that other substances can also be used as long as they have a property of transporting more holes than electrons. For the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by the electron-injection layer, to the light-emitting layer. The electron-transport layer is a layer containing an electron-transport material. For the electron-transport material, a substance having an electron mobility greater than or equal to $1\times10^{-6}$ cm²/Vs is preferable. Note that other substances can also be used as long as they have a property of transporting more electrons than holes. For the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from the cathode to the electron-transport layer, and a layer containing a material with a high electron-injection property. For the material with a high electron-injection property, an alkali metal, an alkaline earth metal, or a compound thereof can be used. For the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride (CaF$_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiO$_x$), or cesium carbonate can be used.

Alternatively, for the electron-injection layer, an electron-transport material may be used. For example, a compound having an unshared electron pair and having an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to –3.6 eV and less than or equal to –2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. For the light-emitting substance, a substance that exhibits an emission color of blue, purple, bluish purple, green, yellowish green, yellow, orange, red, or the like is appropriately used. For the light-emitting substance, a substance that emits near-infrared light can also be used.

Examples of the light-emitting substances include a fluorescent material, a phosphorescent material, a TADF material, and a quantum dot material.

Examples of the fluorescent materials include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). For one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 4

In this embodiment, a high-resolution display device will be described.

Structure Example of Display Panel

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display device may be a horizontal rectangular shape, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves sense of reality.

Figures 17A, 17B, 17C, 17D, 17E, 17F, 17G, 17H, 17I, 17J:
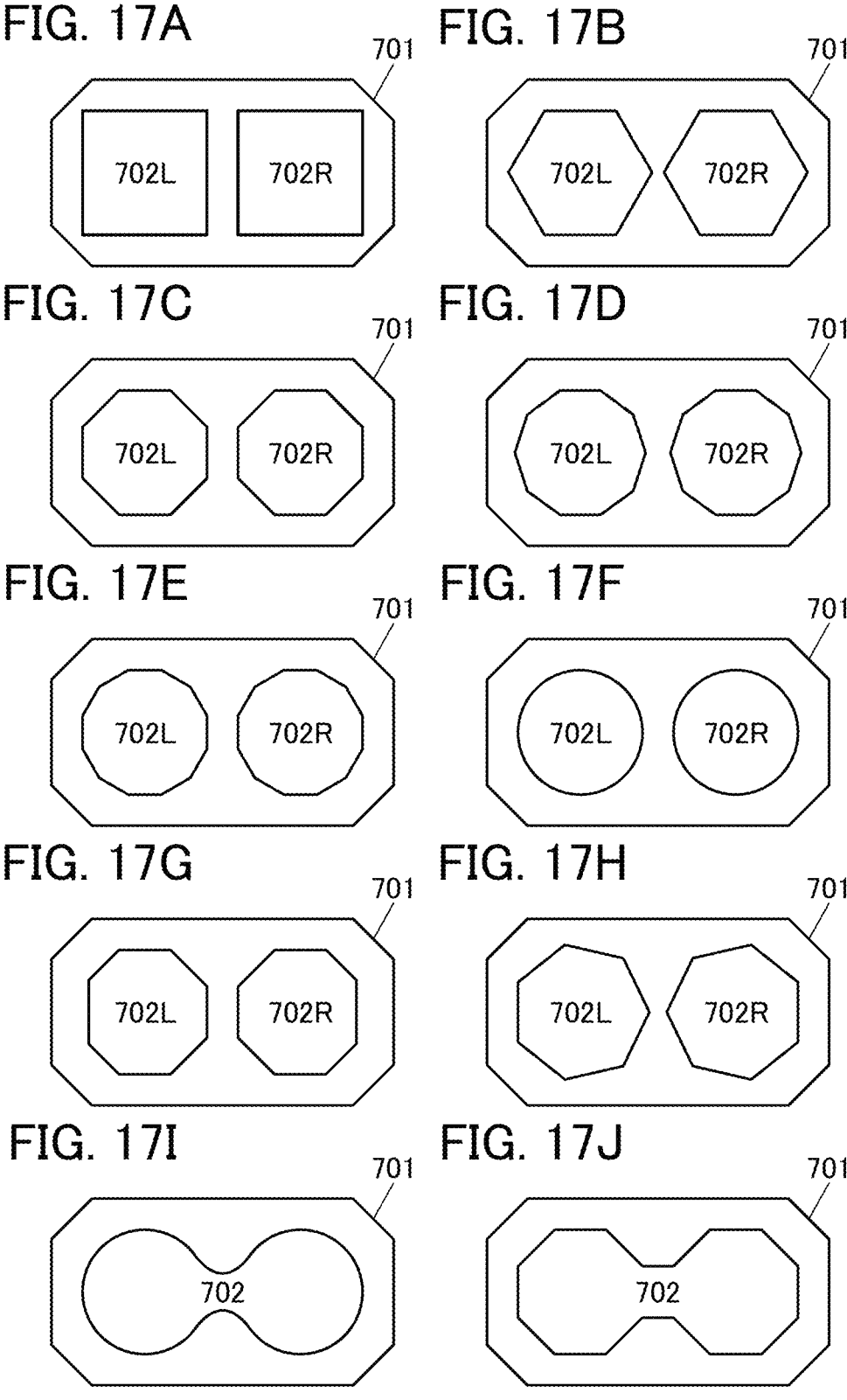
FIG. 17A to FIG. 17J are diagrams illustrating structure examples of a display device.

FIG. 17A illustrates a structure example of a display panel. In FIG. 17A, a display portion 702L for the left eye and a display portion 702R for the right eye are provided inward from a substrate 701. Note that in addition to the display portion 702L and the display portion 702R, a driver circuit, a wiring, an IC, an FPC, or the like may be provided over the substrate 701.

The display portion 702L and the display portion 702R illustrated in FIG. 17A have a square top surface shape.

The top surface shapes of the display portion 702L and the display portion 702R may be other regular polygons. FIG. 17B illustrates an example in which the top surface shape is a regular hexagon; FIG. 17C illustrates an example in which the top surface shape is a regular octagon; FIG. 17D illustrates an example in which the top surface shape is a regular decagon; and FIG. 17E illustrates an example in which the top surface shape is a regular dodecagon. When a polygon with even-numbered corners is used as above, the shape of the display portion can be bilaterally symmetrical. Note that a polygon that is not a regular polygon may be used. Moreover, a regular polygon or a polygon with rounded corners may be used.

Since the display portion consists of pixels arranged in a matrix, a linear portion of the outline of the display portion is not strictly a straight line and can be partly a stair-like portion. In particular, a linear portion that is not parallel to the direction of pixel arrangement has a stair-like top surface shape. Since the user watches images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

FIG. 17F illustrates an example in which the top surface shapes of the display portion 702L and the display portion 702R are circular.

The top surface shapes of the display portion 702L and the display portion 702R may be bilaterally asymmetrical. Moreover, the top surface shapes may not necessarily be regular polygonal.

FIG. 17G illustrates an example in which the top surface shapes of the display portion 702L and the display portion 702R are bilaterally asymmetric octagonal. FIG. 17H illustrates an example in which the top surface shape is regular heptagonal. Even when the top surface shapes of the display portion 702L and the display portion 702R have a bilaterally asymmetrical shape in this manner, the display portion 702L and the display portion 702R are preferably arranged bilaterally symmetrically. Consequently, an image with no unnaturalness can be provided.

Although the structures where the display portion is divided into two are described above, the display portions may have a continuous shape.

FIG. 17I illustrates an example in which the two circular display portions in FIG. 17F are connected. FIG. 17J illustrates an example in which the two regular octagonal display portions in FIG. 17C are connected.

The above is the description of the structure examples of the display panel.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 5

In this embodiment, a metal oxide (also referred to as an oxide semiconductor) that can be used in the OS transistor described in the above embodiment is described.

The metal oxide used in the OS transistor preferably contains at least indium or zinc, and further preferably contains indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more kinds selected from gallium, aluminum, yttrium, and tin, and further preferably M is gallium.

The metal oxide can be formed by a sputtering method, a chemical vapor deposition (CVD) method such as a metal organic chemical vapor deposition (MOCVD) method, an atomic layer deposition (ALD) method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, the XRD spectrum of the quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—Zn oxide film deposited at room temperature is in an intermediate state, which is neither a single crystal nor polycrystal nor an amorphous state, and it cannot be concluded that In—Ga—Zn oxide film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductors include the above-described CAAC-OS and nc-OS. Other examples of the non-single-crystal oxide semiconductors include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor having a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga, Zn) layer) are stacked. Indium and gallium can be replaced with each other. Therefore, indium may be contained in the (Ga, Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor having small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of flexibility of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<Structure of Oxide Semiconductor>

Next, the above-described CAC-OS will be described in detail. Note that the CAC-OS relates to the material composition.

[CAC-OS]

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof and these regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used for a deposition gas. The proportion of the flow rate of an oxygen gas in the total flow rate of the deposition gas during deposition is preferably as low as possible. For example, the proportion of the flow rate of an oxygen gas in the total flow rate of the deposition gas is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

On the other hand, the second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

A transistor using the CAC-OS has high reliability. Thus, the CAC-OS is the most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^3$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 6

In this embodiment, electronic devices of one embodiment of the present invention will be described with reference to FIG. 18 to FIG. 21.

An electronic device in this embodiment includes the display device of one embodiment of the present invention. In the display device of one embodiment of the present invention, increases in resolution, definition, and sizes are easily achieved. Thus, the display device of one embodiment of the present invention can be used for a display portion of a variety of electronic devices.

The display device of one embodiment of the present invention can be fabricated at low cost, which leads to a reduction in the manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or notebook personal computer, a monitor of a computer or the like, digital signage, and a large game machine such as a pachinko machine.

In particular, the display device of one embodiment of the present invention can have a high resolution, and thus can be suitably used for an electronic device including a relatively small display portion. Examples of such an electronic devices include information terminals (wearable devices) such as watch-type and bracelet-type information terminals and wearable devices capable of being worn on the head, such as a VR device like a head-mounted display and a glasses-type AR device. Examples of wearable devices include an SR (Substitutional Reality) device and an MR (Mixed Reality) device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840× 2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the display device with such high definition or high resolution, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, and the like on a display portion. When the electronic device includes the antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 18A:
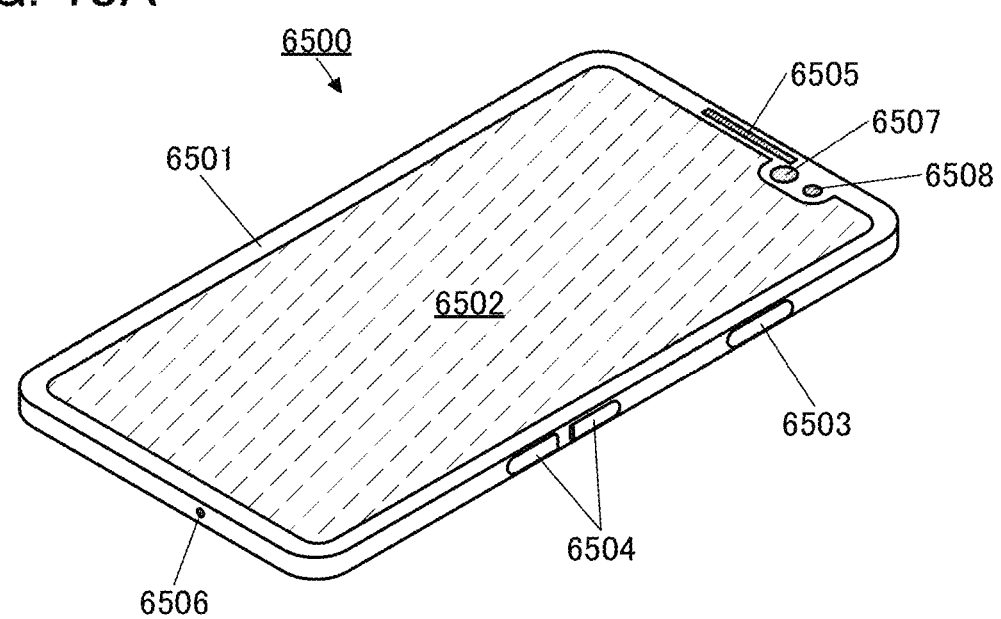
FIG. 18A and FIG. 18B are diagrams illustrating an example of an electronic device.

An electronic device 6500 illustrated in FIG. 18A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 18B:
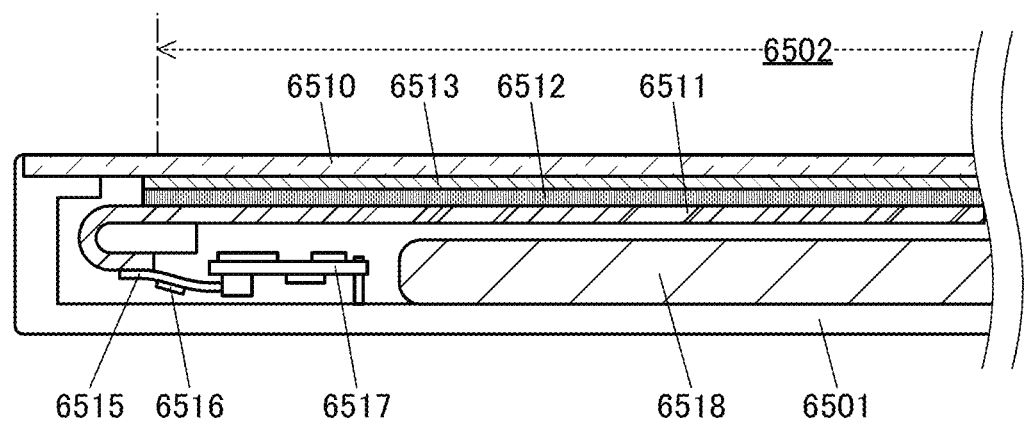

FIG. 18B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outward from the display portion 6502, and an FPC 6515 is connected to the part that is folded back. An IC 6516 is mounted on the FPC 6515. The FPC 6515 is connected to a terminal provided on the printed circuit board 6517.

A flexible display (a display device having flexibility) of one embodiment of the present invention can be used for the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

FIG. 19A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 19A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 19B illustrates an example of a notebook personal computer. A notebook personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

FIG. 19C and FIG. 19D illustrate examples of digital signage.

Digital signage 7300 illustrated in FIG. 19C includes a housing 7301, the display portion 7000, a speaker 7303, and the like. Furthermore, the digital signage 7300 can include an LED lamp, an operation key (including a power switch or an operation switch), a connection terminal, a variety of sensors, a microphone, and the like.

FIG. 19D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 19C and FIG. 19D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 19C and FIG. 19D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 20A is a diagram illustrating the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing 8001 may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

FIG. 20B is a diagram illustrating the appearance of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display device of one embodiment of the present invention can be used in the display portion 8204.

FIG. 20C to FIG. 20E are diagrams illustrating the appearance of a head-mounted display 8300. The head-mounted display 8300 includes a housing 8301, a display portion 8302, a fixing band 8304, and a pair of lenses 8305.

A user can perceive display on the display portion 8302 through the lenses 8305. Note that the display portion 8302 is preferably curved and placed because the user can feel a high realistic sensation. In addition, when another image displayed on a different region of the display portion 8302 is perceived through the lenses 8305, three-dimensional display using parallax, or the like can also be performed. Note that the number of display portions 8302 provided is not limited to one; two display portions 8302 may be provided so that one display portion is provided for one eye of the user.

The display device of one embodiment of the present invention can be used for the display portion 8302. The display device of one embodiment of the present invention can achieve extremely high resolution. For example, a pixel is not easily perceived by the user even when the user perceives display that is magnified by the use of the lenses 8305 as illustrated in FIG. 20E. In other words, a video with a strong sense of reality can be perceived by the user with the use of the display portion 8302.

FIG. 20F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can perceive display on the display portion 8404 through the lenses 8405. The lens 8405 has a focus adjustment mechanism and the focus adjustment mechanism can adjust the position of the lenses 8405 according to the user's eyesight. The display portion 8404 is preferably a square or a horizontal rectangle. Accordingly, realistic sensation can be increased.

The mounting portion 8402 preferably has plasticity and elasticity to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used.

Furthermore, when a sponge or the like whose surface is covered by cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 21A to FIG. 21F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 21A to FIG. 21F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The display device of one embodiment of the present invention can be used in the display portion 9001.

The details of the electronic devices illustrated in FIG. 21A to FIG. 21F are described below.

Figure 21A:
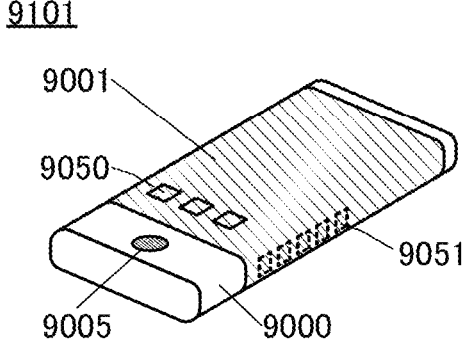
FIG. 21A to FIG. 21F are diagrams illustrating examples of electronic devices.

FIG. 21A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display letters and image information on its plurality of surfaces. FIG. 21A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 21C:
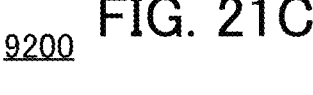
Figure 21C:
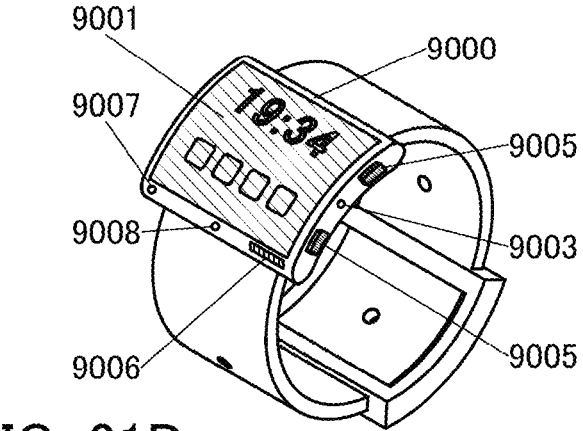
Figure 21B:
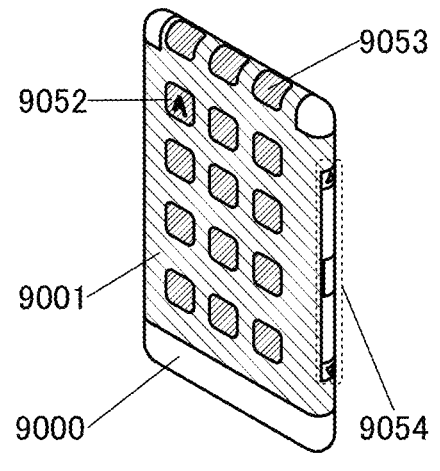

FIG. 21B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer a call, for example.

FIG. 21C is a perspective view illustrating a watch-type portable information terminal 9200. The portable information terminal 9200 can be used as a smartwatch (registered trademark), for example. The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be charged. Note that the charging operation may be performed by wireless power feeding.

Figure 21D:
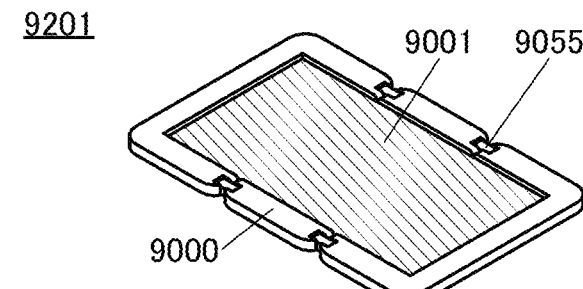
Figure 21E:
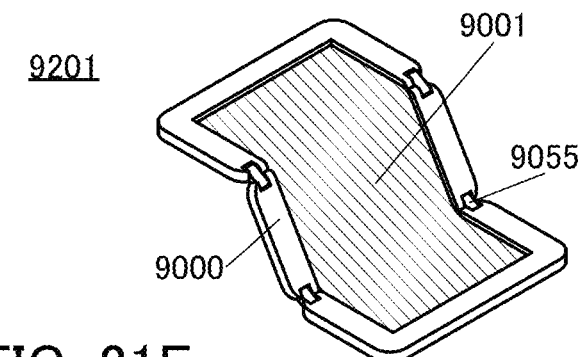
Figure 21F:
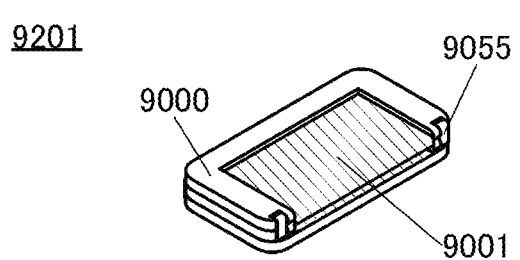

FIG. 21D to FIG. 21F are perspective views illustrating a foldable portable information terminal 9201. FIG. 21D is a perspective view of an opened state of the portable information terminal 9201, FIG. 21F is a perspective view of a folded state thereof, and FIG. 21E is a perspective view of a state in the middle of change from one of FIG. 21D and FIG. 21F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Example

In this example, an insulating layer that covers an end portion of a pixel electrode was formed and the step coverage was checked when an EL layer was formed.

First, a glass substrate was prepared over which a pixel circuit including a transistor, a wiring, and the like and a planarization film over the pixel circuit had been formed. Next, the conductive layer 111*a* and the conductive layer 111*b* were stacked over the planarization film to form a pixel electrode. Next, for the insulating layer 131 covering an end portion of the pixel electrode and the insulating layer 132 covering the insulating layer 131, the insulating layer 132*a* and the insulating layer 132*b* were stacked. Next, the EL film 112Rf, the sacrificial film 144, and the sacrificial film 146 were formed.

For the conductive layer 111*a*, an alloy of silver (Ag), palladium (Pd), and copper (Cu) (Ag—Pd—Cu (APC)) was deposited by a sputtering method to have a film thickness of 100 nm. For the conductive layer 111*b*, an indium tin oxide containing silicon oxide (ITSO) was deposited by a sputtering method to have a film thickness of 100 nm.

For the insulating layer 131, a photosensitive polyimide was formed to have a thickness of approximately 1 μm.

For the insulating layer 132a, a silicon nitride film was formed by a plasma CVD method to have a thickness of approximately 50 nm. For the insulating layer 132b, a silicon oxynitride film was formed by a plasma CVD method to have a thickness of approximately 150 nm.

For the EL film 112Rf, a hole-injection layer, a hole-transport layer, a light-emitting layer, and an electron-transport layer were formed by an evaporation method to have a thickness of approximately 200 nm. For the sacrificial film 144, a metal oxide film was formed by an ALD method to have a thickness of approximately 30 nm. For the sacrificial film 146, a metal oxide film which is different from the sacrificial film 144 was formed by a sputtering method to have a thickness of approximately 50 nm.

Figure 22A:
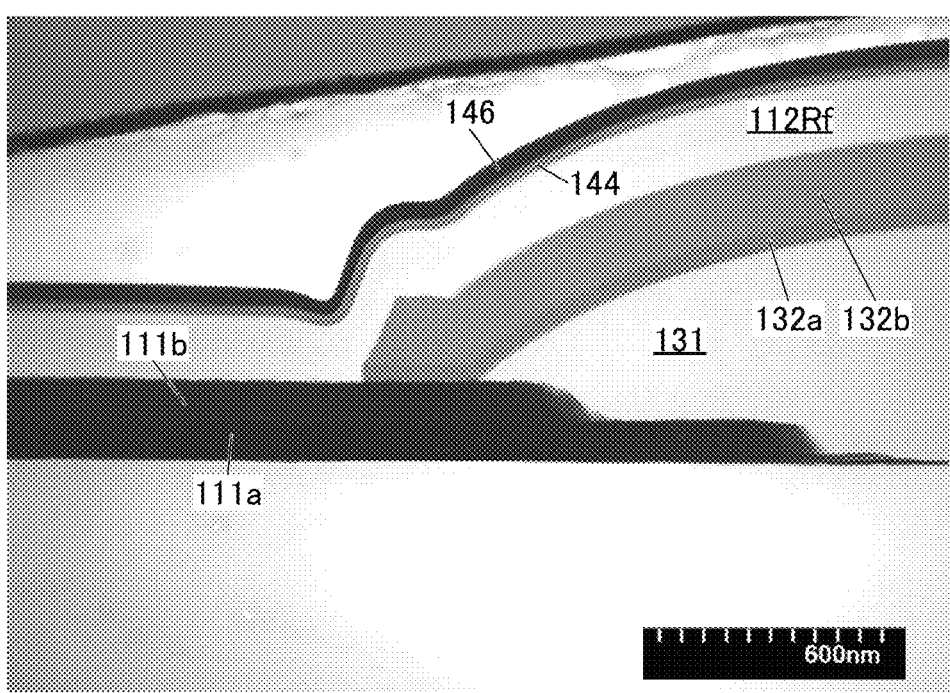
FIG. 22A is a cross-sectional observation image.
Figure 22B:
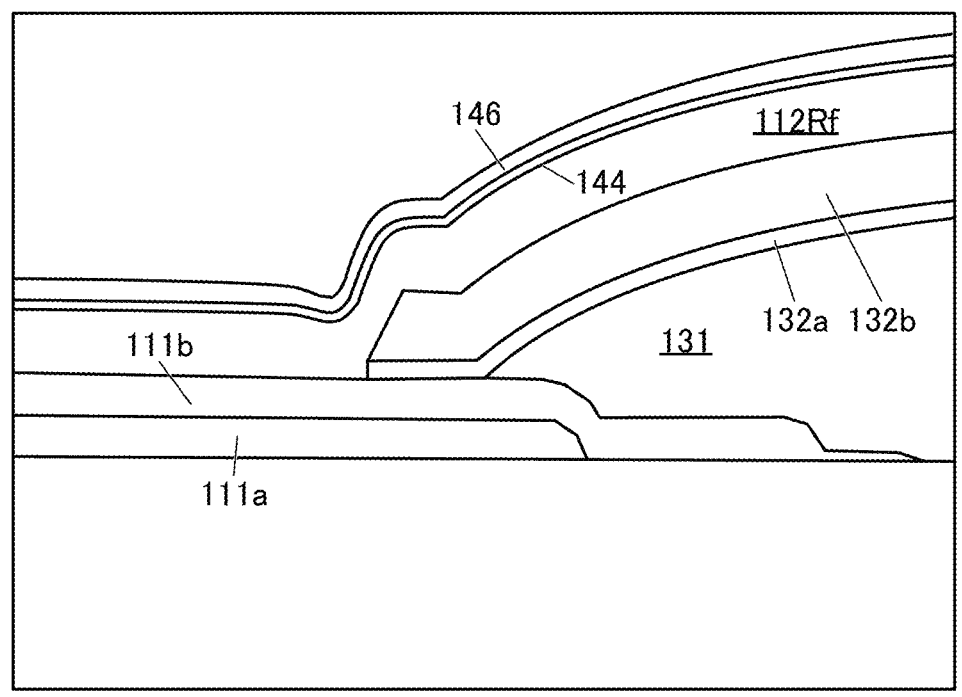
FIG. 22B is a schematic diagram of the cross section.

A cross section of the substrate over which the sacrificial film 146 had been formed in this manner was observed. FIG. 22A is a cross-sectional STEM image of the end portions of the insulating layer 131, the insulating layer 132a, and the insulating layer 132b and the vicinity thereof. FIG. 22B is a schematic view illustrating the outline of the layers of FIG. 21A.

As shown in FIG. 22A, it was found that a taper angle of the end portion of the insulating layer 132a is different from a taper angle of the end portion of the insulating layer 132b. The taper angle of the insulating layer 132a is approximately 90°, and the taper angle of the insulating layer 132b is approximately 65°.

It was found that the EL film 112Rf favorably covers surfaces of the insulating layer 132a and the insulating layer 132b. Furthermore, the sacrificial film 144 and the sacrificial film 146 over the EL layer 112Rf also favorably covered the EL layer 112Rf, and a defect was not observed.

The above is the description of Example.

REFERENCE NUMERALS 100, 100A to 100F: display device, 101: substrate, 110: light-emitting element, 110R, G, B, P, Q: light-emitting element, 111: pixel electrode, 111a, b: conductive layer, 111R, G, B, P, Q: pixel electrode, 111C: connecting electrode, 112: EL layer, 112R, G, B, P, Q: EL layer, 112Rf, Gf, Bf EL layer, 113: common electrode, 114: EL layer, 115R, G, B: optical adjustment layer, 121: protective layer, 130: connection portion, 131, 132a, b: insulating layer, 131f, 132f: insulating film, 133: space, 141, 143a to 143c: resist mask, 141f resist film, 144, 144a to 144c: sacrificial film, 145, 145a to 145c: sacrificial layer, 146, 146a to 146c: sacrificial film, 147, 147a to 147c: sacrificial layer, 151: photomask, 152, 153: light

The invention claimed is:
1. A display device comprising:
   a first pixel electrode, a second pixel electrode, a first insulating layer, a second insulating layer, a first EL layer, a second EL layer, and a common electrode,
   wherein the first pixel electrode and the second pixel electrode are provided side by side,
   wherein the first insulating layer covers an end portion of the first pixel electrode and an end portion of the second pixel electrode,
   wherein part of an end portion of the first insulating layer overlaps with a top surface of the first pixel electrode and another part of the end portion of the first insulating layer overlaps with a top surface of the second pixel electrode, wherein the second insulating layer is provided over the first pixel electrode, the second pixel electrode, and the first insulating layer and covers the end portion of the first insulating layer,
   wherein part of an end portion of the second insulating layer overlaps with the top surface of the first pixel electrode and another part of the end portion of the second insulating layer overlaps with the top surface of the second pixel electrode,
   wherein the first EL layer is provided over the first pixel electrode,
   wherein the second EL layer is provided over the second pixel electrode,
   wherein an end portion of the first EL layer and an end portion of the second EL layer face each other and overlap with the first insulating layer,
   wherein the common electrode comprises a portion overlapping with the first EL layer and a portion overlapping with the second EL layer,
   wherein the first insulating layer comprises an organic resin,
   wherein the second insulating layer comprises an inorganic insulating material,
   wherein the second insulating layer comprises a first insulating film and a second insulating film over the first insulating film, and
   wherein a first angle formed by a side surface and a bottom surface of the first insulating film is different from a second angle formed by a side surface and a bottom surface of the second insulating film.
2. The display device according to claim 1,
   wherein the first insulating layer comprises a curved surface between a top surface and the end portion, and
   wherein the second insulating layer comprises a portion in which an angle formed by a side surface and a bottom surface is greater than or equal to 20° and less than 90°.
3. The display device according to claim 1,
   wherein the first insulating layer comprises an acrylic resin, a polyimide resin, an epoxy resin, a polyamide resin, a polyimide-amide resin, a siloxane resin, a benzocyclobutene-based resin, a phenol resin, or a precursor of these resins.
4. The display device according to claim 1,
   wherein the second insulating layer comprises a depressed portion in a region overlapping with neither the first EL layer nor the second EL layer.
5. The display device according to claim 1,
   wherein the second insulating layer is separated into a first region and a second region,
   wherein the first region overlaps with the first EL layer and does not overlap with the second EL layer, and
   wherein the second region does not overlap with the first EL layer and overlaps with the second EL layer.
6. The display device according to claim 1,
   wherein the first insulating film is thinner than the second insulating film, and
   wherein the first angle is greater than the second angle.
7. The display device according to claim 1,
   wherein the second insulating film is thinner than the first insulating film, and
   wherein the second angle is greater than the first angle.
8. The display device according to claim 1,
   wherein the first insulating film comprises a silicon nitride film, and
   wherein the second insulating film comprises a silicon oxynitride film.

9. A fabrication method of a display device, comprising:

forming a first pixel electrode and a second pixel electrode;

forming a photosensitive resin film to cover the first pixel electrode and the second pixel electrode;

forming a first insulating layer to cover an end portion of the first pixel electrode and an end portion of the second pixel electrode performing light exposure by using a first photomask and development on the resin film;

forming an inorganic insulating film to cover the first pixel electrode, the second pixel electrode, and the first insulating layer;

forming a resist film over the inorganic insulating film;

forming a resist mask by performing light exposure by using the first photomask and development on the resist film; and forming a second insulating layer to cover a top surface of the first pixel electrode, a top surface of the second pixel electrode, and a top surface of the first insulating layer by etching the inorganic insulating film that is not covered by the resist mask, wherein the second insulating layer comprises a first insulating film and a second insulating film over the first insulating film, and wherein a first angle formed by a side surface and a bottom surface of the first insulating film is different from a second angle formed by a side surface and a bottom surface of the second insulating film.

10. The fabrication method of a display device according to claim 9, wherein a first EL layer is formed over the first pixel electrode after the formation of the second insulating layer, wherein a second EL layer is formed over the second pixel electrode, wherein a common electrode is formed over the first EL layer and the second EL layer, and wherein the first EL layer and the second EL layer are processed into an island shape or a band-like shape by a photolithography method.

11. The fabrication method of a display device according to claim 9, wherein the first insulating layer comprises an acrylic resin, a polyimide resin, an epoxy resin, a polyamide resin, a polyimide-amide resin, a siloxane resin, a benzocyclobutene-based resin, a phenol resin, or a precursor of these resins.

12. The fabrication method of a display device according to claim 9, wherein the first insulating film is a silicon nitride film, and wherein the second insulating film is a silicon oxynitride film.

* * * * *